United States Patent
Lindström et al.

(10) Patent No.: US 11,264,520 B2
(45) Date of Patent: *Mar. 1, 2022

(54) METHOD FOR FOR PRODUCING A PHOTOVOLTAIC DEVICE

(71) Applicant: Exeger Operations AB, Stockholm (SE)

(72) Inventors: Henrik Lindström, Åkersberga (SE); Giovanni Fili, Danderyd (SE)

(73) Assignee: Exeger Operations AB, Stockholm (SE)

( * ) Notice: Subject to any disclaimer, the term of this patent is extended or adjusted under 35 U.S.C. 154(b) by 404 days.

This patent is subject to a terminal disclaimer.

(21) Appl. No.: 16/321,640

(22) PCT Filed: Jul. 12, 2017

(86) PCT No.: PCT/EP2017/067633
§ 371 (c)(1),
(2) Date: Jan. 29, 2019

(87) PCT Pub. No.: WO2018/019598
PCT Pub. Date: Feb. 1, 2018

(65) Prior Publication Data
US 2021/0280808 A1    Sep. 9, 2021

(30) Foreign Application Priority Data

Jul. 29, 2016 (SE) .................................. 1651090-1
Nov. 21, 2016 (SE) .................................. 1651521-5

(51) Int. Cl.
*H01L 31/028* (2006.01)
*H01L 51/00* (2006.01)
(Continued)

(52) U.S. Cl.
CPC ......... *H01L 31/028* (2013.01); *H01G 9/2009* (2013.01); *H01G 9/2045* (2013.01);
(Continued)

(58) Field of Classification Search
CPC ............. H01L 51/4253; H01L 51/0037; H01L 51/0026; H01L 51/0017
See application file for complete search history.

(56) References Cited

U.S. PATENT DOCUMENTS 4,357,100 A    11/1982   Appleby
8,158,880 B1    4/2012   Girt et al.
(Continued)

FOREIGN PATENT DOCUMENTS

CN    102414910 B    8/2014
CN    104795464 A    7/2015
(Continued)

OTHER PUBLICATIONS

Williams et al.; "Conducting polymer and hydrogenated amorphous silicon hybrid solar cells"; Applied Physics Letters; 87(22): 223504-223504-3 (2005).
(Continued)

*Primary Examiner* — Anthony Ho
(74) *Attorney, Agent, or Firm* — Dilworth & Barrese, LLP

(57) ABSTRACT

The present invention relates to a method for manufacturing a photovoltaic device comprising: —forming a porous first conducting layer on one side of a porous insulating substrate, —coating the first conducting layer with a layer of grains of a doped semiconducting material to form a structure, —performing a first heat treatment of the structure to bond the grains to the first conducting layer, —forming electrically insulating layers on surfaces of the first conducting layer, —forming a second conducting layer on an
(Continued)

opposite side of the porous insulating substrate, —applying a charge conducting material onto the surfaces of the grains, inside pores of the first conducting layer, and inside pores of the insulating substrate, and—electrically connecting the charge conducting material to the second conducting layer.

17 Claims, 7 Drawing Sheets

(51) Int. Cl.

| | | |
|---|---|---|
| H01L 51/44 | (2006.01) | |
| H01L 31/0352 | (2006.01) | |
| H01G 9/20 | (2006.01) | |
| H01L 31/048 | (2014.01) | |
| H01L 31/05 | (2014.01) | |
| H01L 51/42 | (2006.01) | |
| H01L 31/032 | (2006.01) | |
| H01L 31/0384 | (2006.01) | |
| H01L 31/072 | (2012.01) | |
| H01L 31/18 | (2006.01) | |

(52) U.S. Cl.
CPC ........ *H01L 31/032* (2013.01); *H01L 31/0384* (2013.01); *H01L 31/03529* (2013.01); *H01L 31/0481* (2013.01); *H01L 31/05* (2013.01); *H01L 31/072* (2013.01); *H01L 31/182* (2013.01); *H01L 51/0006* (2013.01); *H01L 51/0017* (2013.01); *H01L 51/0026* (2013.01); *H01L 51/0037* (2013.01); *H01L 51/4213* (2013.01); *H01L 51/4253* (2013.01); *H01L 51/44* (2013.01); *Y02E 10/542* (2013.01); *Y02E 10/549* (2013.01)

(56) References Cited

U.S. PATENT DOCUMENTS

| | | | |
|---|---|---|---|
| 9,252,319 | B2 | 2/2016 | Loscutoff et al. |
| 10,796,858 | B2* | 10/2020 | Lindstrom ........... H01G 9/2031 |
| 2009/0159120 | A1 | 6/2009 | Wang et al. |
| 2009/0308442 | A1 | 12/2009 | Liu |
| 2011/0000537 | A1 | 1/2011 | Myong |
| 2011/0048525 | A1 | 3/2011 | Yoneya et al. |
| 2012/0285521 | A1 | 11/2012 | Huang et al. |
| 2013/0000703 | A1 | 1/2013 | Lee et al. |
| 2014/0096813 | A1 | 4/2014 | Komiya et al. |
| 2014/0166095 | A1 | 6/2014 | Loscutoff et al. |
| 2015/0129034 | A1 | 5/2015 | Snaith et al. |

FOREIGN PATENT DOCUMENTS

| | | |
|---|---|---|
| EP | 1624472 A2 | 2/2006 |
| EP | 2003700 A2 | 12/2008 |
| JP | 2004087546 A | 3/2004 |
| KR | 20130006954 A | 1/2013 |
| WO | 2011/030117 A1 | 3/2011 |
| WO | 2013/149787 A1 | 10/2013 |
| WO | 2013/171520 A1 | 11/2013 |
| WO | 2014/030686 A1 | 2/2014 |
| WO | 2014/184379 A1 | 11/2014 |
| WO | 2015/031944 A1 | 3/2015 |
| WO | 2015/117795 A1 | 8/2015 |
| WO | 2016/110851 A1 | 7/2016 |

OTHER PUBLICATIONS

Saba et al., "Hierarchically Porous Polymer Monoliths by Combining Controlled Macro- and Microphase Separation," Journal of the American Chemical Society, 137(28): 8896-8899 (Jul. 10, 2015).

Jäckle et al., "Junction formation and current transport mechanisms in hybrid n-Si/PEDOT:PSS solar cells," Scientific Reports 5, Aug. 17, 2015, pp. 1-12.

* cited by examiner

METHOD FOR FOR PRODUCING A PHOTOVOLTAIC DEVICE

FIELD OF THE INVENTION

The present invention relates to the field of photovoltaic devices including light absorbing layers, such as solar cells. More particularly the invention relates to a method for producing a photovoltaic device.

BACKGROUND OF THE INVENTION

Photovoltaic devices provide conversion of light into electricity using semiconducting materials that exhibit a photovoltaic effect.

A typical photovoltaic system employs solar panels, each comprising a number of solar cells, which generate electrical power. A solar cell or photovoltaic device is a device which directly converts sunlight into electricity. Light incident on the surface of the solar cell produces electric power. A solar cell has a light absorbing layer. When the energy of a photon is equal to or greater than the band gap of the material in the light absorbing layer, the photon is absorbed by the material and a photo-excited electron is generated. The front surface is doped in another way than the base, creating a PN-junction. Under illumination, photons are absorbed, thereby creating an electron-hole pair that is separated in the PN-junction. On the backside of the solar cell a metal plate collects excess charge-carriers from the base, and on the front side metal wires collect excess charge-carriers from the emitter.

Silicon is the most commonly used semiconductor material in solar cells. Silicon has several advantages, for example, it is chemically stable, and provides a high efficiency due to its high ability to absorb light. Standard silicon solar cells are made from thin wafers of doped silicon. A disadvantage with silicon wafers is that they are expensive.

The front surface of the silicon wafer is doped in another way than the base, creating a PN-junction. During production of the solar cell, a number of samples of doped silicon wafers must be cut or sawed from a silicon ingot, and then the samples of silicon wafers are assembled electrically to a solar cell. Since the silicon ingot must have extremely high purity and since the sawing is time-consuming and creates significant amounts of waste material, the production of such solar cells is expensive.

On the backside of a traditional solar cell a metal plate collects excess charge-carriers from the base, and on the front side metal grids and metal wires collect excess charge-carriers from the emitter. Thus, conventional silicon solar cells have a front-side contacted emitter. A problem with using current collecting grids and wires on the front side of the solar cell is that there is a trade-off between good current collection and light harvesting. By increasing the size of the metal wires, the conduction is increased and the current collection is improved. However, by increasing the size of the metal grids and wires more of the sun harvesting area is shaded, leading to a reduced efficiency of the solar cell.

A known solution to this problem is rear contact solar cells. US 2014166095 A1 describes how to make a back contact back junction silicon solar cell. Rear contact solar cells achieve higher efficiency by moving the front-side contacted emitter to the rear side of the solar cell. The higher efficiency results from the reduced shading on the front side of the solar cell. There exist several configurations of rear contact solar cells. For example, in back-contacted back-junction (BC-BJ) silicon solar cells, the emitter area and all wiring are placed on the backside of the solar cell resulting in effective removal of any shadowing components from the front side of the solar cell. However, the production of these BC-BJ silicon solar cells is both complex and costly.

WO 2013/149787 A1 discloses a dye-sensitized solar cell having a rear contact. The solar cell includes a porous insulating layer, a working electrode including a porous conducting metal layer formed on top of the porous insulating layer, and a light absorbing layer containing an adsorbed dye arranged on top of the porous conducting metal layer to face the sun. The light absorbing layer comprises $TiO_2$ metal oxide particles dyed by light absorbing dye molecules on the surface of the $TiO_2$ particles. The dye-sensitized solar cell further includes a counter electrode including a conducting layer disposed on an opposite side of the porous insulating layer. An electrolyte is filled between the working electrode and the counter electrode. An advantage of this solar cell is that it is easy and fast to manufacture, and accordingly it is cost effective to produce. A disadvantage of this type of solar cell compared to a silicon solar cell is that its maximum efficiency is lower due to the fact that the dye molecules have less ability to absorb light than silicon.

In a further development of the dye-sensitized solar cells, the efficiency of the cells has been augmented by the use of perovskites as a substitute to the dye infused $TiO_2$ layer. WO2014/184379 discloses a dye-sensitized solar cell having light absorbing layer comprising a perovskite. An advantage of using a perovskite is that higher solar cell efficiencies can be reached. However, perovskite solar cells have several disadvantages, for example, they are difficult to manufacture, expensive, unstable and environmentally hazardous.

In order to reduce the cost of solar cells it has been proposed to use silicon grains instead of solid silicon wafers.

U.S. Pat. No. 4,357,400 discloses a solar cell with doped silicon particles in redox electrolyte. The solar cell includes an insulating substrate having two conducting layers interleaved on one side of the substrate. Discrete semiconductor particles of one type of doping are positioned on one of the conducting layers, and semiconducting particles of an opposite type of doping are positioned on the other conducting layer. All is immersed in a redox electrolyte and encapsulated. The redox electrolyte contacts the particles, whereby a voltage potential is generated across the two conducting layers in response to photons impinging on the semiconductor particles. The conducting layers are thin layers of, for example, aluminium. The conducting layers are sputtered and etched on a substrate in a pattern, for example, with interdigitated fingers. The semiconducting particles can be applied by silk screening and glued to the surface of the conductors. A disadvantage with this solar cell is that the manufacturing process is complicated and time-consuming. Thus, the solar cell is expensive to manufacture.

CN20151101264 describes a traditional solar cell with a silicon wafer and front and back contacts. In order to improve fill factor and conversion efficiency luminous porous silicon particles are spin coated onto the surface of the silicon wafer of the solar cell. The silicon grains are prepared by electrochemical etching in HF and ethanol solution and thereafter grinded to 2-200 nm particle sizes. A disadvantage with this type of solar cell is that the silicon grains are attached to a silicon wafer thereby creating a large and voluminous silicon structure US2011/0000537 describes a solar cell having a light absorbing layer including hydrogenated amorphous silicon, a non-silicon based element and crystalline silicon grains embedded in the hydrogenated amorphous silicon based material.

JP2004087546 describes a method of forming a silicon film by using a composition containing Si particles. The Si particles are formed by crushing silicon ingots and milling the parts to suitable size. The particles are washed to remove silicon oxide and mixed with a dispersion medium. After application of the composition onto a glass substrate, the substrate is heat-treated and a silicon film is obtained.

It is known to use organic materials to produce photovoltaic devices with the aim of reducing manufacturing costs. The organic material is in contact with an inorganic semiconducting material and by that a heterojunction is created in which electrons and holes are separated.

The use of hybrid inorganic-organic solar cells combining monocrystalline n-type silicon (n-Si) and a highly conductive polymer poly(3,4-ethylenedioxythiophene)-poly(styrene sulfonate) (PEDOT:PSS) is described in an article entitled "Junction formation and current transport mechanisms in hybrid n-Si/PEDOT:PSS solar cells" in Scientific reports published Aug. 17, 2015 and written by Sara Jäckie, Matthias Mattiza, Martin Liebhaber, Gerald Brönstrup, Mathias Rommel, Klaus Lips, and Silke Christiansen. The article describes a n-type Si-wafer laminated to an In/Ga eutectic back contact and a PEDOT:PSS layer on top of the wafer together with an Au grid front contact.

US2012/0285521 describes a photovoltaic device in which an inorganic semiconducting layer is laminated with an organic layer and a metal anode grid is positioned on top of the organic layer and a cathode layer is positioned under the Si layer. For example, the semiconducting layer is, made of a silicon wafer and the organic layer is, for example, made of PEDOT:PSS. A disadvantage with this photovoltaic device is that the metal anode grid is positioned on top of the organic layer, and accordingly it shades a part of the sun harvesting area leading to a reduced efficiency of the solar cell.

OBJECT AND SUMMARY OF THE INVENTION

It is an object of the present invention to at least partly overcome the above mentioned problems and to provide a method for manufacturing an improved photovoltaic device.

This object is achieved by a method for manufacturing a photovoltaic device as defined herein.

The method comprises:
forming a porous first conducting layer on one side of a porous insulating substrate,
coating the first conducting layer with a layer of grains of a doped semiconducting material to form a structure,
performing a first heat treatment of the structure to bond the grains to the first conducting layer,
forming electrically insulating layers on surfaces of the first conducting layer,
forming a second conducting layer on the opposite side of the porous insulating substrate,
applying a charge conducting material onto the surfaces of the grains, inside pores of the first conducting layer, and inside pores of the insulating substrate, and
electrically connecting the charge conducting material to the second conducting layer.

The method according to the invention makes it possible to produce a photovoltaic device at a low cost, which is environmentally friendly, and has a high conversion efficiency. The method according to the invention is significantly easier compared to traditional methods for manufacturing of silicon solar cells based on wafers or thin films.

A photovoltaic device produced with the method according to the invention comprises a plurality of grains of a doped semiconducting material, and a charge conductor made of a charge conducting material partly covering the grains so that a plurality of junctions are formed between the grains and the charge conductor. The junctions are interfaces between the grains and the charge conductor capable of providing separation of photo-excited electrons and holes. The grains are in electrical and physical contact with the charge conductor to form the junctions. Depending on the type of semiconducting material and the charge conducting material, the junctions can be homojunctions or heterojunctions.

With a doped semiconductor is meant a semiconductor comprising a dopant, for example, boron (p-type), phosphor (n-type), or arsenic (n-type). To produce a doped semiconductor, a dopant is added to semiconductor. Depending on the type of dopant material, the semiconductor becomes p-doped or n-doped.

With the term structure is meant device produced so far. For example, in step two the structure comprises the porous insulating substrate, the first conducting layer, and the layer of grains.

A charge conductor as used herein is made of a hole conducting material or an electron conducting material. In a hole conducting material the majority charge carriers are holes, and in an electron conducting material the majority charge carriers are electrons. A hole conducting material is a material that mainly allows transport of holes and that mainly prevents transport of electrons. An electron conducting material is a material that mainly allows transport of electrons and that mainly prevents transport of holes. An ideal charge conductor is capable of forming a junction together with the grain where the formed junction is capable of separating photo-generated electrons and holes. An ideal charge conductor accepts and conducts only one type of charge carrier and blocks the other type of charge carrier. For example, if the charge conductor is an ideal hole conductor the charge conductor conducts only holes, and blocks electrons from entering the hole conductor. If the charge conductor is an ideal electron conductor the charge conductor conducts only electrons, and will block holes from entering the electron conductor.

The charge conductor serves several purposes. A main purpose is to provide junctions where electrons and holes can be separated. A second purpose is to conduct away one type of charge carrier from the junction. A third purpose is to bind the grains mechanically to each other and to bind the grains mechanically to the first conducting layer to form a mechanically robust photovoltaic device.

The grains are attached to a first conducting layer. Since part of the grain surface is in physical contact with the first conducting layer, the charge conductor can only partly cover the entire surface area of the grain. The remaining free surface areas of the grains are preferably covered with the charge conductor so that a plurality of junctions are formed between the grains and the charge conductor.

The material of the light absorbing layer is significantly cheaper than the light absorbing layer of traditional silicon solar cells, since it can be made of powder including semiconductor grains instead of expensive wafers, and since the amount of semiconducting material needed is less than for traditional semiconductor solar cells. Suitably, the semiconducting material is silicon. However, other semiconducting material can also be used, such as CdTe, CIGS, CIS, GaAs, or perovskite. The material of the light absorbing layer is also cheaper than a light absorbing layer of a dye-sensitized solar cell, since a cheap semiconductor, such as silicon, can be used as a light absorber instead of more expensive dye molecules.

Due to the grains, the surface of the light absorbing layer becomes rougher compared to the case where wafers are used. As compared to a planar silicon wafer, the rougher surface of the grains increases the probability for reflected light to be absorbed, which reduces efficiency losses due to reflections in the surface. Thus, the need of an anti-reflection coating, often used on the surface of a traditional silicon solar cells, is reduced or is no longer necessary.

The charge conductor is disposed on the grains as well as in spaces formed between the grains. Most of the grains are covered with a layer of the charge conductor covering a major part of the surface of the grain. This enables a large part of the incident light to be converted into electricity, which leads to a high conversion efficiency. Since the charge conducting material has a certain intrinsic mechanical stability, the charge conducting material acts as glue between the grains, thus stabilizing the light absorbing layer. Moreover, the charge conductor also glues together the grains and the first conducting layer and, thereby, improves the mechanical adhesion of the grains and the first conducting layer. This improves the physical strength of the light absorbing layer and the adhesion of the grains to the first conducting layer.

Preferably, the charge conductor is disposed on the grains so that most of the grains are covered with a charge conducting layer covering a major part of the surface of the grain. A charge conducting layer is a layer made of a charge conducting material, as defined above. Preferably, the charge conductor is disposed on the grains so that the charge conductor forms a charge conducting layer covering the free surface of the grains. If the charge conducting layer is too thick, the conducting layer will act as a light absorbing filter preventing some of the light from reaching the grain. Preferably, the charge conducting layer has a thickness between 10 nm and 200 nm. More preferably, the charge conducting layer has a thickness between 50 nm and 100 nm, and even more preferably between 70 nm and 90 nm. Such thin layers will allow most of the light to penetrate through the charge conducting layer and reach the grains.

Preferably, the entire free surface of a grain, i.e. the surface not in contact with the substrate/conducting layer, is covered by the charge conductor. The coverage of charge conductor of the free surface may include minor disruptions in the coverage due to variations in process parameters or charge conductor material properties. The coverage may also be disrupted due to the geometries of the grains preventing full coverage of the free surface. The charge conductor may also include small grains/particles, and the spaces between the grains/particles may cause disruptions in the coverage of the grains. The disruptions in coverage will reduce the efficiency of the cell.

The charge conducting material is applied so that the pores of the first conducting layer, and the pores of the insulating substrate are filled with the charge conducting material. The first conducting layer and the insulating substrate are porous allowing the charge conductor to be accommodated in pores of the first conducting layer, and in pores of the porous insulating substrate so that a plurality of charge conducting paths are formed from the light absorbing layer, through the first conducting layer and through the insulating substrate to the second conducting layer. A charge conducting path is a path made of a charge conducting material, as defined above, which allows transport of charges, i.e. electrons or holes. Further, the charge conducting material is applied so that it is in electrical contact with the second conducting layer. For example, the second conducting layer is disposed on the surface of the porous insulating substrate and by that the second conducting layer is in electrical contact with the charge conducting material accumulated in the pores of the insulating substrate. Alternatively, a second porous insulating substrate is arranged between the first porous insulating substrate and the second conducting layer and the pores of the second porous insulating substrate are filled with the charge conducting material in electrical contact with the second conducting layer.

The method comprises forming a second conducting layer on an opposite side of the porous insulating substrate. Thus, the first and the second conducting layers are formed on different sides of the porous insulating substrate. This step can be carried out in different ways and in different order. The formation of the second conducting layer can be carried out before as well as after performing the first heat treatment of the structure. For example, the second conducting layer is formed by depositing an ink including conducting particles on the opposite side of the porous insulating substrate. Alternatively, the second conducting layer is attached to the opposite side of the porous insulating substrate to form a sandwich structure.

Electrically insulating layers are formed on the available surfaces of the first conducting layer in order to avoid electrical contact between the charge conducting material and the first conducting layer and by that avoiding shortcut between the first and second conducting layers. This step should be performed before the charge conducing material is applied.

The first and second conducting layers can be connected to an external circuit.

According to an embodiment of the invention, the layer of grains is a monolayer. The grains are disposed on the first conducting layer so that a monolayer of grains is formed on the first conducting layer. The grains can be deposited directly onto the first conducting layer. The deposition of the grains can be made with simple processes like spraying, printing or the like. A monolayer contains only one single layer of grains, in opposite to a multi-layer that contains two or more layers of grains on top of each other. In a monolayer of grains, a main part of the grains is in direct physical and electrical contact with the first conducting layer. Thus, most of the grains contribute to the power generation, achieving a high efficiency of the photovoltaic device. In a multi-layer of grains, only the grains of the lowest layer are in direct physical and electrical contact with the first conducting layer, and the other grains only have indirect contact with the first conducting layer. A disadvantage with a multi-layer of grains is that a main part of the grains only has indirect electrical contact with the first conducting layer, which causes a lower efficiency of the photovoltaic device. Further, in a monolayer of grains, a main part of the grains has an upper surface facing the light and a lower surface being in direct mechanical and electrical contact with the first conducting layer. The upper surface is covered with the charge conducting material. The distribution of the grains on the first conducing layer may lead to thin gaps between the grains. Preferably, those gaps can be filled with smaller grains that fit in the gaps.

Due to the fact that the grains are in direct physical and electrical contact with the first conducting layer, the distance the electrons have to travel before they are collected is short, and accordingly the probability for the electrons and holes to recombine before they are collected is low. This leads to high conversion efficiency.

A portion of the surface of each of the grains is in physical and electrical contact with the first conducting layer, and the predominant part of the remaining free surface of each of the grains is covered with the charge conductor. Each of the grains has an upper part covered with the charge conductor, and a lower part in physical and electrical contact with the first conducting layer. It is important that the lower part of the grains, which is in electrical contact with the first conducting layer, does not form a low ohmic junction with the charge conductor, in order to avoid electrical short circuit. If the electrical resistance between the charge conductor and the lower part of the grain is too low, then the losses due to short circuit will be too high. Thus, the parts of the surfaces of the grains, which are in electrical contact with the first conducting layer, should not be covered with the charge conductor. Preferably, the remaining surface of the grain is covered with the charge conductor to achieve a high conversion efficiency. Ideally, the charge conductor covers the entire remaining free surface of the grains.

The first conducting layer collects the photo-excited electrons from the junctions and transports the electrons to an external circuit outside the photovoltaic device. Due to the fact that the grains are in direct physical and electrical contact with the first conducting layer, the distance the electrons have to travel before they are collected is short, and accordingly the probability for the electrons and holes to recombine before they are collected is low. Thus, an advantage with a photovoltaic device produced by a method according to the invention, compared to a traditional photovoltaic, is that the electrical resistive losses in the light absorbing layer are less, due to the shorter distance for the electrons to travel before they are collected. The distance for charge carriers to be collected by the first conducting layer ranges typically from a few micrometres to tens of micrometres, whereas in a traditional silicon wafer solar cell the electrons typically need to travel several thousands of micrometres, i.e. several millimetres, to reach the front side current collector or several hundred micrometres to reach the back side current collector.

Preferably, the layer of grains covers most of the surface of the substrate. The charge conductor covers at least 50%, and more preferably at least 70%, and most preferably at least 80% of the available surface of the grains. The larger areas of the grains that are covered by the hole-conductor, the higher is the conversion efficiency, i.e. a larger part of the incident light is converted to electricity. Ideally, the charge conductor covers the entire free available surface of each grain. The available surface of the grains is the part of the surface not in contact with the first conducting layer.

The conducting particles are bonded to each other, and the grains are bonded to the conducting particles during the first heat treatment. Preferably the first heat treatment of the structure is performed in a non-oxidizing environment. Most of the grains are preferably arranged at a distance from each other, and are not bonded to each other during the first heat treatment and thereby remain individual grains. Suitably, the grains are made of silicon, the conducting particles are made of metal or a metal alloy, and the boundaries between the particles and the grains comprise metal silicon alloy or metal silicide. Thus, the electrical contact between the grains and the particles is improved.

According to an embodiment of the invention, the average size of the grains is larger than 1 µm, preferably larger than 10 µm, and most preferably larger than 20 µm. Thus, the surfaces of the grains are large and by that their ability to absorb light is large. If the grains are too small, their ability to absorb light is reduced.

According to an embodiment of the invention, the average size of the grains is less than 300 µm, preferably less than 80 µm, and most preferably less than 50 µm. Too large grains may lose in efficiency due to the distance to the grain/charge conductor interfaces.

The average size of the grains is suitably between 1 µm and 300 µm. The average size of the grains is preferably between 10 µm and 80 µm, and most preferably the average size of the grains is between 20-50 µm. This embodiment provides a method for producing a thin photovoltaic device with high efficiency. Due to the monolayer of grains, the thickness of the light absorbing layer depends on the size of the grains. A silicon wafer is typically about 150-200 µm. The light absorbing layer according to the invention can be made thinner and more flexible than the light absorbing layer of a traditional semiconductor solar cell. The light absorbing layer according to the invention can, for example, be made about 40-80 µm, if grains having a size between 40-80 µm is used.

According to an embodiment of the invention, the method comprises depositing an ink including a powder of said grains on the first conducting layer. The light absorbing layer can, suitably be manufactured by depositing an ink including the grains onto the first conducting layer. The ink can be deposited in any suitable pattern on the surface. The charge conductor material is then deposited on the free surface of the grains. The ink can, for example, be deposited by printing or spraying.

According to an embodiment of the invention, the grains are deposited on the first conducting layer by means of electrostatic spraying. Electrostatic spraying using dry powder consisting of grains has proven to be particularly suitable to provide thin monolayers of grains on the first conducting layer.

According to an embodiment of the invention, the method comprises oxidizing the grains before performing the first heat treatment of the structure in a non-oxidizing environment. The oxidation provides the surface of the grains with a protective oxide layer, which protect the grains from contamination during the first heat treatment. The first heat treatment is, for example, carried out in a vacuum furnace and particles from the oven may cause contamination of the grains.

According to an embodiment of the invention, the grains are made of doped silicon. Silicon is a cheap, environmentally friendly and stable material with high conversion efficiency. Silicon has a high ability to absorb light, which leads to high efficiency of the light absorbing layer. The silicon can be a crystalline, pure, solar grade type with a low degree of impurities or polycrystalline grains. The silicon can be n-type doped or p-type doped.

According to an embodiment of the invention, the method comprises performing a first etching of the silicon grains to form {111} pyramidal planes on the grains before coating the first conducting layer with the grains. The etching can, for example, be made using potassium hydroxide (KOH). The first etching provides grains predominantly having {111} planes exposed at the surface of the grains. The charge conductor is in contact with the {111} pyramidal planes of the grains. This causes light trapping, which means that the light is reflected several times in the surfaces, and by that the light absorption of the grains is increased. Since the grains will show a multitude of angels towards the incident light, the efficiency of the photovoltaic device does not depend critically on the angle of incidence of the light with respect to the layer, as is the case with planar silicon wafers. Thus, the optical losses are reduced compared to a planar silicon wafer.

According to an embodiment of the invention, the method comprises performing a second etching of the grains after performing the second heat treatment and before applying the charge conducting material onto the surfaces of the grains. The second etching can, for example, be made using hydrogen fluoride (HF). The second etching of the grains provides cleaning of the surfaces of the grains before applying the charge conducting material, which improves the electrical contact between the grains and the charge conducting material.

According to an embodiment of the invention, the charge conducting material is any of a conducting polymer, an inorganic material, and a metal-organic material. Suitably, the charge conductor is poly (3,4-ethylenedioxythiophene)-poly (styrene sulfonate) called PEDOT:PSS. PEDOT:PSS is a highly conductive hole conducting polymer. The charge conductor can also be made of an inorganic material, or a metal-organic material.

According to an embodiment of the invention, the charge conductor is made of PEDOT:PSS and the grains are made of doped silicon. N-doped silicon is to be preferred together with PEDOT, since PEDOT is a hole conductor. The dopant of the n-doped silicon is, for example, phosphor. PEDOT:PSS works well together with silicon and together they can achieve a high light-to-electric energy conversion efficiency.

According to an embodiment of the invention, the applying of charge conducting material onto the surface of the grains comprises applying a liquid based solution containing particles of the charge conducting material onto the surface of the grains, inside pores of the first conducting layer, and inside the pores of the insulating substrate, and drying the structure so that a layer of solid charge conductor is deposited on the grains and a solid charge conductor is deposited inside the pores of the first conducting layer and the pores of the insulating substrate.

According to an embodiment of the invention, the step forming a porous first conducting layer on one side of a porous insulating substrate comprises depositing an ink including conducting particles on one side of the porous insulating substrate. The depositing can, for example, be done by printing or spraying.

The conducting particles are at least partly covered with an insulating oxide during the second heat treatment. The parts of the surfaces of the conducting particles, which are not in contact with the grains, are covered with oxide. The oxide provides a protective and electrically insulating layer on the particles, which prevents that electrons or holes are transferred between the conducting layer and the charge conductor, and thereby prevents short circuit between the conducting layer and the charge conductor.

According to an embodiment of the invention, the conducting particles are made of titanium or an alloy thereof. Titanium is a suitable material to be used in the conducting layer due to its ability to withstand corrosion and because it can form a good electrical contact to silicon. A layer of titanium oxide is formed on the titanium particles during the second heat treatment. The titanium oxide provides a protective oxide layer on the titanium particles, which prevents short circuit between the first conducting layer and the charge conductor.

According to an embodiment of the invention, the conducting particles comprise titanium, the grains comprise doped silicon, and the silicon of the grains and the titanium of the particles react and form titanium silicide in the boundaries between the grains and the particles during the first heat treatment. Thus, titanium silicide is formed in the boundaries between the grains and the first conducting layer during the first heat treatment. Titanium silicide has good electrical conducting properties. Due to the fact that the boundaries between the grains and the first conducting layer comprise titanium silicide, the electrical contact between the grains and the first conducting layer is improved. Titanium silicide can exist in several variations, for example, $TiSi_2$, $TiSi$, $Ti_5Si_4$, $Ti_5Si_3$, $Ti_3Si$. Suitably, the boundaries between the grains and the first conducting layer comprise $TiSi_2$. $TiSi_2$ exists in two variations: $C49-TiSi_2$ and $C54-TiSi_2$.

According to an embodiment of the invention, the conducting particles are made of aluminium or an alloy thereof. Suitably, the conducting particles comprise aluminium, and the parts of the surfaces of the conducting particles, which are not in contact with the grains, are covered with oxide such as aluminium oxide during the second heat treatment.

According to an embodiment of the invention, the method comprises applying a pressure on the layer of grains so that portions of the grains project into the first porous conducting layer after the coating of the first conducting layer and before performing the first heat treatment of the structure. Due to the fact that lower portions of the grains are project into the first porous conducting layer, the areas of the contact surfaces between the grains and the porous conducting layer are increased. By increasing the contact area, bonding between the grains and the porous conducting layer is facilitated. The increased contact area further leads to an improved electrical contact between the grains and the conducting layer. For example, the grains are bonded to the porous conducting layer by means of sintering.

According to an embodiment of the invention, the porous insulating substrate is a porous glass microfiber based substrate.

According to an embodiment of the invention, the first heat treatment comprises heat treating the structure in vacuum with a temperature above 550° C. during at least two hours.

According to an embodiment of the invention, the charge conductor comprises particles made of a semiconducting material of a different type of doping than the grains. Thus, a plurality of junctions, where photo-excited electrons and holes are separated, is formed in the interfaces between the grains and the particles. For example, the junctions are PN-junctions.

The insulating substrate is disposed between the first and second conducting layers to electrically insulate the first and second conducting layers. The charge conductor is electrically coupled to the second conducting layer and electrically insulated from the first conducting layer. The charge conductor can be directly or indirectly electrically connected to the second conducting layer. The light absorbing layer is disposed on the first conducting layer. Thus, the first and second conducting layers are placed on the rear side of the light absorbing layer. An advantage with this embodiment, is that it has a back contact. Instead of using current collecting grids and wires on the front side of the light absorbing layer, which is facing the sun, first and second conducting layers are arranged on a rear side of the light absorbing layer. Thus, there is no shading of the light absorbing layer and increased efficiency is achieved. Another advantage with this embodiment is that the first conducting layer is arranged between the insulating layer and the light absorbing layer. Thus, the conducting layers of the device do not have to be transparent, and can be made of a material of high conductivity, which increases the current-handling capability and ensures high efficiency of the device. A first contact can be electrically coupled to the first conducting layer, and a second contact can be electrically coupled to the second conducting layer. Thus, the first contact is electrically coupled to the doped semiconducting material of the light absorbing layer, and the second contact is electrically coupled to the charge conductor. The first and second contacts can be disposed on the edges of the device, instead of on a front side. Thus, there is no shading of the light absorbing layer and increased efficiency is achieved.

According to an embodiment of the invention, the method comprises forming a porous second conducting layer on an opposite side of the porous insulating substrate, and the step applying a charge conducting material onto the surface of the grains comprises applying the charge conducting material inside pores of the second conducting layer. For example, the porous second conducting layer is formed by depositing an ink including conducting particles on the opposite side of the porous insulating substrate. The first and second conducting layers and the insulating substrate can be made porous to the extent that the charge carrying material can penetrate through the structure and be connected with the second conducting layer. In order to exclude short-circuits between the first and second layers and recombination of holes and electrons, the first conducting layer should be isolated from the charge conducting material by means of the insulating oxide layer. The grains are indirectly electrically connected to the second conducting layer via the charge conductor, and possibly via other layers of the device. Thus, each grain in the light absorption layer is directly or indirectly connected to the first and second conducting layers and forms a photovoltaic electrical circuit.

According to an embodiment of the invention, the step forming electrically insulating layers on surfaces of the first conducting layer comprises performing a second heat treatment of the structure in an oxidizing environment to form insulating oxide layers on the available surfaces of the first conducting layer. The method comprises performing a second heat treatment of the structure in an oxidizing environment. The second heat treatment of the structure produces an insulating oxide on the first conducting layer, which electrically insulates the charge conductor from the first conducting layer.

According to an embodiment of the invention, the step forming electrically insulating layers on surfaces of the first conducting layer comprises depositing an insulating coating onto the available surfaces of the first conducting layer. Instead of using the second heat treatment of the structure in an oxidizing environment, it is possible to deposit a thin insulating coating onto the available surface of the first conducting layer, for example, by printing. By printing a certain amount of an ink containing insulating material on the first conducting layer it is possible to fill the pores in the first conducting layer with ink. By evaporating away the solvent of the ink, insulating material in the ink is deposited onto the available inner and outer surface of the first conducting layer. The dried ink coating can be heated to create an insulating coating that adheres to the available surface of the first conducting layer.

Instead of using the second heat treatment of the structure in an oxidizing environment it is possible to deposit a thin insulating coating onto the available surface of the first conducting layer by printing. By printing a certain amount of an ink containing insulating material on the first conducting layer it is possible to fill the pores in the first conducting layer with ink. By evaporating away the solvent of the ink, insulating material in the ink is deposited onto the available inner and outer surface of the first conducting layer. The dried ink coating can be heated to create an insulating coating that adheres to the available surface of the first conducting layer. The coating can be porous and alternatively it can be compact. The coating can consist of, e.g. $TiO_2$, $Al_2O_3$, $ZrO_2$, aluminosilicate, $SiO_2$ or other electrically insulating materials or combination or mixtures of materials. In order to further improve the electrical insulation between the first conducting layer and the charge conducting material it is possible to combine the above steps by first performing a second heat treatment of the structure in an oxidizing environment to form insulating oxide layers on the available surfaces of the first conducting layer, and then depositing a thin insulating coating on the oxide layers of the first conducting layer.

BRIEF DESCRIPTION OF THE DRAWINGS

The invention will now be explained more closely by the description of different embodiments of the invention and with reference to the appended figures.

DETAILED DESCRIPTION OF PREFERRED EMBODIMENTS OF THE INVENTION

Figure 1:
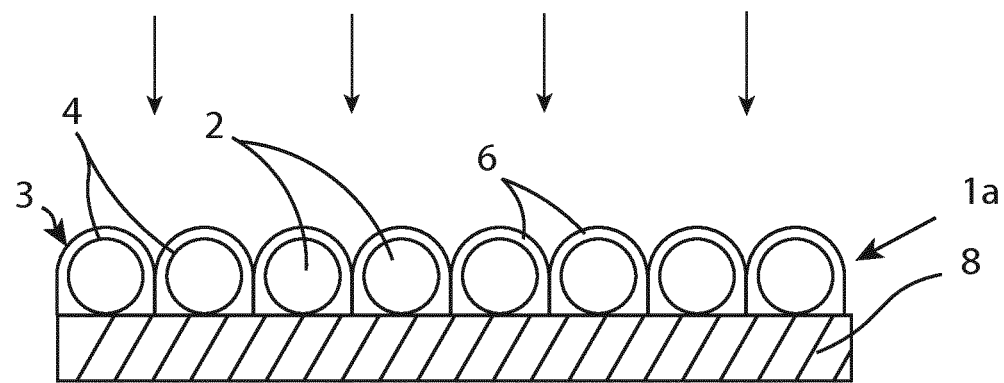
FIG. 1 shows an example of a light absorbing layer according to a first embodiment of the invention.

FIG. 1 shows a schematic drawing of a light absorbing layer 1a produced with a method according to the invention. The light absorbing layer 1a comprises a plurality of grains 2 made of a doped semiconducting material, and an electric charge conductor 3 in physical and electrical contact with the grains 2. A junction 4 is formed in the contact area between the charge conductor 3 and the grains 2. The grains 2 are partly covered with the charge conductor 3 so that a plurality of junctions 4 are formed between the grains and the charge conductor. Preferably, at least 50% of the surface of the grains 2 is covered with the charge conductor.

The semiconducting material of the grains 2 has the ability to absorb photons, which excite electrons from a valence band to a conduction band and by that create electron-hole pairs in the semiconducting material. Suitably, the semiconducting material is silicon. However, other semiconducting material can also be used, such as CdTe, CIGS, CIS, GaAs, or perovskite. Preferably, the average size of the grains is between 1 µm and 300 µm, and typically, the average size of the grains 2 is between 20 µm and 100 µm.

The charge conductor 3 is made of a solid material, i.e. not liquid, and can be a hole conductor or an electron conductor. If the grains are n-doped, the charge conductor 3 preferably is a hole conductor, and if the grains are p-doped, the charge conductor 3 preferably is an electron conductor. The charge conductor 3 is made of a charge conducting material, for example, a doped semiconducting material, such as silicon, or an organic conducting material, such as a conducting polymer. Several transparent, conductive polymers with sufficient conductivity may be used for this purpose. An example of a suitable hole conducting polymer to be used in combination with silicon grains is poly (3,4-ethylenedioxy-thiophene) polystyrene sulfonate (PEDOT:PSS). PEDOT:PSS is a polymer mixture of two ionomers. Other examples of suitable material for the charge conductor 3 are polyaniline, P3HT and Spiro-OMeTAD. If a polymer conductor is used, the charge conductor comprises a plurality of particles made of a polymer or mixtures of polymers. The particles of the charge conductor partly cover the surface of the grains. The junctions 4 have the ability to provide separation of the pairs of photo-excited electrons and holes. Depending on the materials of the grains and the charge conductor, the junctions are homojunctions, such as p-n-junctions, or heterojunctions.

A homojunction is an interface between similar semiconductor materials. These materials have equal band gaps but typically have different doping. For example, a homojunction occurs at the interface between an n-doped and p-doped semiconductor, a so called a PN junction.

A heterojunction is the interface between any two solid-state materials, including crystalline and amorphous structures of metallic, insulating, fast ion conductor and semiconducting materials. The two solid-state materials can be made of a combination of two inorganic materials or a combination of two organic materials or a combination of one inorganic and one organic material.

The grains 2 are essentially evenly distributed in the light absorbing layer, and the charge conductor 3 is located on the grains and in the space between the grains. The size and shape of the grains 2 may vary. The light absorbing layer 1a is applied to a conducting layer 8. For example, the layer 8 is a conducting layer. The grains 2 are in physical as well as electrical contact with the layer 8. A lower portion of the grains may be protruding into the conducting layer 8.

Figure 3:
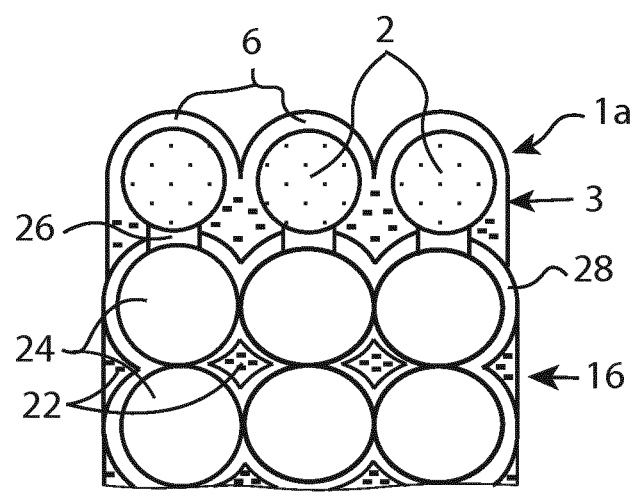
FIG. 3 shows an enlarged view of a part of the photovoltaic device shown in FIG. 2.

In the example shown in FIG. 3, the charge conductor 3 is an organic conductor. The charge conductor is disposed on the surfaces of the grains 2 so that a charge conducting layer 6 is formed on the grains. Thus, the surface of each of the grains 2 is partly covered with the charge conducting material. Preferably, the charge conducting layer 6 has a thickness between 10 nm and 200 nm. Typically, the charge conducting layer 6 has a thickness between 50 nm and 100 nm. The charge conductor 3 is disposed between the grains so that the grains are bonded to each other by means of the charge conductor. Thus, the charge conductor increases the mechanical strength of the light absorbing layer. The charge conducting layer 6 is a mono layer. Each of the grains has an upper surface facing the incident light and a lower surface in direct physical and electrical contact with the conducting layer 8. The upper surface of the grains is wholly or at least partly covered with the charge conductor 3, and the lower surface is free from charge conductor to enable electrical contact with the conducting layer 8.

Figure 2:
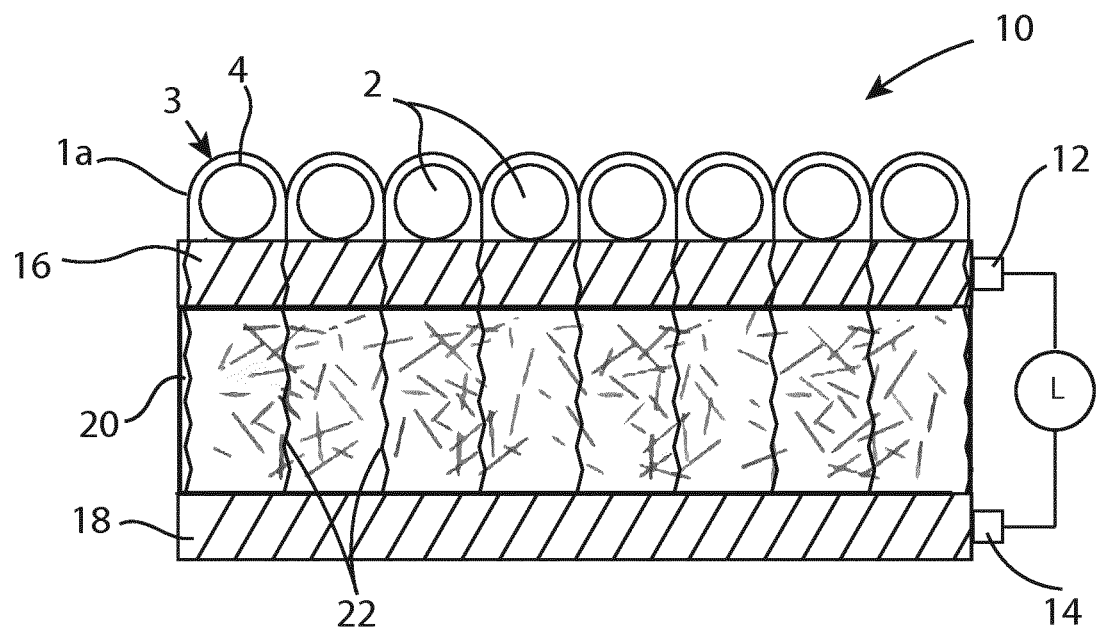
FIG. 2 shows schematically a cross-section though a photovoltaic device according to a first embodiment of the invention.

FIG. 2 shows schematically a cross-section though an example of a photovoltaic device 10 produced with a method according to an embodiment of the invention. In this embodiment, the photovoltaic device 10 is a solar cell. FIG. 3 shows an enlarged view of a part of the photovoltaic device 10. The photovoltaic device 10 comprises the light absorbing layer 1a including the grains 2 and the charge conductor 3 as shown in FIG. 1, a first conducting layer 16 in electrical contact with the grains 2 of the light absorbing layer 1a, a second conducting layer 18 electrically coupled to the charge conductor 3, and an insulating layer 20 disposed between the first and second conducting layers 16, 18, to electrically insulate the first and second conducting layers. The light absorbing layer 1a is positioned on a top side of the photovoltaic device. The top side should be facing the sun to allow the sunlight to hit the grains 2 and generate photo-excited electrons. The first conducting layer 16 serves as a back contact that extracts photo-generated electrons from the light absorbing layer 1a. The light absorbing layer 1a is disposed on the first conducting layer. Thus, the distance the excited electrons and/or holes need to travel until they are collected is short. A first contact 12 is electrically connected to the first conducting layer 16, and a second contact 14 electrically connected to the second conducting layer 18. A load L is connected between the contacts 12, 14. The first and second conducting layers 16, 18 are suitably metal layers made of metal or metal alloy, for example, titanium, or aluminium or an alloy thereof.

The device 10 further comprises a plurality of charge conducting paths 22 of a charge conducting material disposed between the light absorbing layer 1a and the second conducting layer 18 to enable charges, i.e. holes or electrons, to travel from the light absorbing layer 1a to the second conducting layer 18. The conducting paths 22 are suitably, but not necessarily, made of the same material as the charge conducting layers 6 on the grains. In this embodiment, the charge conductor 3 forms the layers 6 on the grains as well as the conducting paths 22. The conducting paths 22 penetrate through the first conducting layer 16 and the insulating layer 20. Suitably, the first conducting layer 16 and the insulating layer 20 are porous to allow the charge conductor to penetrate through the first conducting layer and the insulating layer 20 to form the paths 22 to the second conducting layer. The charge conductor 3 can be accommodated in pores of the first conducting layer 16, and in pores of the insulating layer 20. In an embodiment of the invention, the second conducting layer 18 can be porous and the charge conductor 3 can be accommodated in pores of the second conducting layer 18.

The insulating layer 20 may comprise a porous insulating substrate. For example, the porous insulating substrate is made of a glass microfiber or a ceramic microfiber. The first conducting layer 16 is disposed on an upper side of the porous insulating substrate, and the second conducting layer 18 is disposed on a lower side of the porous insulating substrate. The light absorbing layer 1a is disposed on the first conducting layer 16.

FIG. 3 shows an enlarged part of the light absorbing layer 1a and the first conducting layer 16. In this embodiment, the first conducting layer 16 comprises a plurality of conducting particles 24 made of a conducting material. The conducting particles 24 are suitably metal particles made of metal or metal alloy, for example, titanium or aluminium or an alloy thereof. The conducting particles 24 of the first conducting layer are in physical and electrical contact with each other. The grains 2 are in physical and electrical contact with some of the conducting particles 24 of the first conducting layer. Preferably, the grains 2 have a size less than 100 µm in order to provide a sufficient contact area between the grains and the particles 24 of first conducting layer 16. The grains 2 have an upper portion facing away from the photovoltaic device and a lower portion in physical contact with the conducting particles 24 of the first conducting layer. The upper portions of the grains 2 are covered with the conducting layers 6 of the charge conductor 3.

The grains are preferably made of doped silicon, and a zone of physical contact between the silicon grains 2 and the conducting particles 24 of the first conducting layer consists of a layer 26 of metal-silicon alloy or metal silicide in order to provide good electrical contact between the grains 2 and the particles 24. For example, the grains 2 are made of silicon (Si) and the conducting particles 24 are made of titanium (Ti), or at least partly comprise titanium, and the boundaries between the grains 2 and the particles 24 comprise a layer 26 of titanium silicide, which provides good electrical contact between Si and Ti.

Due to the fact that the first conducting layer 16 is formed by a plurality of conducting particles 24 bonded to each other, cavities are formed between the particles. Thus, the first conducting layer 16 allows the charge conductor 3 to extend through the first conducting layer to form the plurality of charge conducting paths 22. The charge conductor 3 is accommodated in some of the cavities formed between the conducting particles 24 in the first conducting layer 16.

In order to avoid electrical contact between the first conducting layer 16 and the conducting paths 22 of the charge conductor 3, the conducting particles 24 are at least partly covered with an insulating layer 28 of an insulating material, for example, an insulating oxide. Preferably, the parts of the surfaces of the conducting particles 24, which are not in contact with the grains 2 or with the other conducting particles 24 in the layer, are covered with the insulating layer 28. The charge conducting paths 22 of the charge conductor 3 are in contact with the insulating layers 28 on the particles 24, as shown in FIG. 3. A layer of insulating metal oxide is, for example, formed by oxidizing the conducting particles 24 during manufacturing of the device 10. The insulating layer 28 of metal oxide provides a protective and electrically insulating layer on the particles, which prevents that charges are transferred between the first conducting layer 16 and the charge conductor 3, and thereby prevents short circuit between the first conducting layer 16 and the charge conductor 3. For example, if the conducting particles comprise titanium, the parts of the surfaces of the titan particles, which are not in contact with the grains, are covered with titanium oxide ($TiO_2$). For example, if the conducting particles comprise aluminium, the parts of the surfaces of the conducting particles, which are not in contact with the grains, are covered with aluminium oxide ($Al_2O_3$).

The second conducting layer 18 may also comprise conducting particles. The conducting particles of the second conducting layer 18 are suitably metal particles made of metal or metal alloy, for example, titanium, aluminium, or an alloy thereof. In this example, the conducting particles (not shown) of the second conducting layer 18 are made of aluminium, and the aluminium particles are not covered with any insulating layer, and accordingly, the charge conductor is allowed to be in electrical contact with the particles of the second conducting layer 18. The conducting particles of the conducting layers 16, 18 are sintered to form the conducting layers. The conducting particles in each of the conducting layers 16, 18 are in electrical contact with each other to form a conducting layer. However, there is also space between the conducting particles to accommodate the charge conductor 3. The junctions 4 on the grains 2 of the light absorbing layer are in electrical contact with the paths 22 of charge conducting material, which are in electrical contact with conducting particles in the second conducting layer 18.

Figure 4:
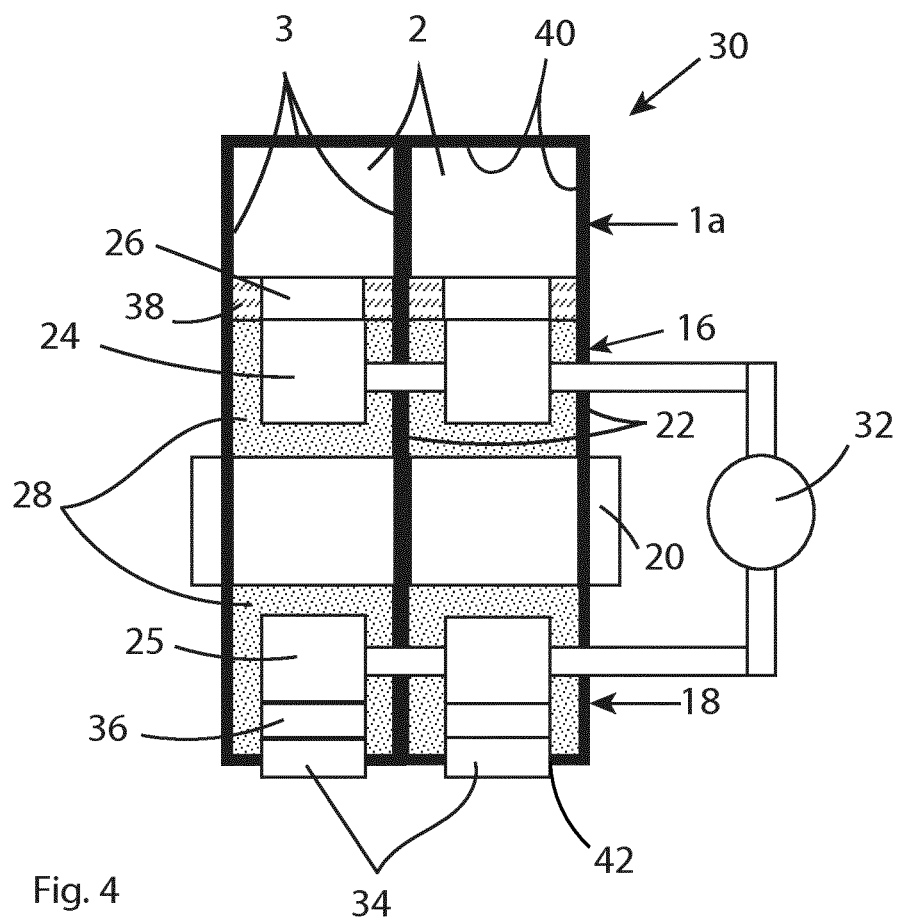
FIG. 4 shows schematically a cross-section though a photovoltaic device according to a second embodiment of the invention.

FIG. 4 shows schematically a cross-section though a part of a photovoltaic device 30 according to a second embodiment of the invention. The photovoltaic device 30 is a solar cell. In FIG. 4 the same and corresponding parts are designated by the same reference numerals as in FIGS. 1-3. FIG. 4 is a very simplified schematic view of the architecture of the device. In this example, the grains 2 are made of n-doped silicon, the first and second conducting layers include conducting particles 24, 25 made of titanium, and the charge conductor 3 is a hole conducting polymer. In this example the hole conducting polymer is PEDOT:PSS, in the following denoted PEDOT. PEDOT is a hole conductor and transports holes to the second conducting layer 18. The n-doped silicon grains are electron conductors and transport electrons to the first conducting layer. The first conducting layer then transports the electrons to the second conducting layer via an external electrical circuit. The grains 2 are, for example, made of crystalline silicon. The silicon grains may have predominantly {111} planes exposed at the surface. Instead of showing many silicon grains 2 and many titanium conducting particles 24, 25, only two silicon grains 2 and two titanium conducting particles 24, 25 in each of the conducting layers 16, 18, are shown. It is to be understood that the real solar cell contains many thousands or even millions of grains 2 lying next to each other in the light absorbing layer. But two particles is the minimum number needed to demonstrate the architecture and the working principle of the solar cell.

The photovoltaic device 30 comprises an insulating layer 20 in the form of a porous insulating substrate, a first conducting layer 16 disposed on one side the insulating layer, a second conducting layer 18 disposed on the opposite side of the insulating layer, and a light absorbing layer 1a disposed on the first conducting layer 16 and in electrical contact with the first conducting layer. The conducting layers 16, 18 are connected to an external electric load 32. The first and second conducting layers 16, 18 are separated physically and electrically by the insulating layer 20. A layer 26 of titanium silicide ($TiSi_2$) is formed between the silicon grains 2 of the light absorbing layer 1a and the titanium conducting particles 24 of the first conducting layer 16. The silicon grains 2 of the light absorbing layer 1a are bonded to the titanium particles. The titanium conducting particles 24 in the first conducting layer 16 are in physical and electrical contact with each other, and the titanium conducting particles 25 in the second conducting layer 18 are in physical and electrical contact with each other.

The titanium particles in the conducting layers 16, 18 are partly covered by insulating layers 28 of insulating titanium oxide ($TiO_2$). The parts of the surfaces of the titanium conducting particles 24, which are in contact with the grains 2 or with the other conducting particles 24 in the layer, are not covered with titanium oxide. A zone 38 between the light absorbing layer 1a and the first conducting layer 16 comprises titanium oxide ($TiO_2$) and silicone oxide ($SiO_2$).

The photovoltaic device 30 differs from the photovoltaic device 10 shown on FIG. 2 in that it comprises a connection site 34 electrically coupled to the second conducting layer 18 and electrically insulated from the first conducting layer. The connection site 34 may comprise a metal layer. In this example, the connection site 34 comprises a layer made of silver (Ag). It is suitable to use silver, since it provides good electrical contact both with titanium and PEDOT. Another advantage with using silver is that silver prevents formation of oxide on the titanium particles 25 of the second conducting layer 18 in the area of contact between the titanium particles and the connection site 34. Instead, a layer 36 of titanium silver (AgTi) is formed between the titanium particles 25 of the second conducting layer 18 and the connection site 34. Thus the PEDOT can form a good low ohmic contact with silver and the silver can form a good low ohmic contact with titanium via the AgTi. Consequently, PEDOT can contact the titanium indirectly via the silver and the AgTi. Other materials may be used in the connection site, for example, carbon based materials such as graphite or amorphous carbon.

The charge conductor 3 is arranged in physical and electrical contact with the grains 2 of the light absorbing layer 1a. The charge conductor 3 is also arranged in electrical contact with the connection site 34, which is electrically coupled to the second conducting layer 18. In this embodiment, the charge conductor 3 is electrically insulated from the first and second conducting layers 16, 18 by means of the insulating layers 28 on the conducting particles 24, 25. The charge conductor 3 covers a main part of the grains 2, and extends through the first conducting layer 16, the insulating layer 20, and the second conducting layer 18, as shown in FIG. 4. The charge conductor 3 is in contact with the oxide layers 28 on the particles in the first and second conducting layers. The charge conductor 3 is electrically insulated from the conducting particles 24, 25, and accordingly from the first and second conducting layers by means of the insulating oxide 28. The charge conductor 3 is in physical and electrical contact with the connection site 34. The charge conductor 3 is indirectly in physical and electrical contact with the titanium particles 25 via the connecting site 34. Thus, the connecting site serves the purpose of making sure that the charge conductor can transfer holes to the titanium particles 25 of the second conducting layer. The photovoltaic device may also comprise a casing or other means for enclosing the photovoltaic device.

In the following, there is a step by step explanation on how the solar cell disclosed in FIG. 4 works:

Step 1. A photon creates an excited electron-hole pair inside the grains 2. In this example, the charge conductor 3 is PEDOT, the grain 2 is made of silicon, and the interface 40 is a PEDOT-silicon interface.

Step 2. The excited electron then travels through the grain 2 and across the zone 26 of metal silicon interface and enters into the conducting particle 24. In this example, the particle 24 is a Ti particle and the layer 26 comprises TiSi2. Thus, the electron passes the Si—TiSi2-Ti interface. The excited hole, on the other hand, travels across the interface 40 into the layer of charge conductor 3.

Step 3. The electron in the conducting particle 24 can then be transferred to neighbouring particles 24 and then be collected in an external electric circuit via an external electric load 32. In the meantime the hole travels inside the charge conducting paths 22 of the charge conductor 3 all the way down to the low ohmic silver layer of the connection site 34.

Step 4. After passing the external electric load 32 the electron is transferred to the second conducting layer 18. The electron is then transferred to the Ti—TiAg—Ag layer 36. The hole in the charge conductor 3 is transferred to the silver layer of the connection site 34 and recombines with the electron in the connection site 34.

Six crucial interfaces can be identified in the example disclosed in FIG. 4:

1. Charge Conductor—Grain Interface

The grains 2 must be essentially oxide free in order to achieve an efficient charge separation of electrons and holes at the interface 40 between the grains 2 and the charge conductor 3 to enable generation of high photocurrent and high photo voltage. The thickness of an oxide layer on the grains should be only a few nanometres thick or even thinner for obtaining efficient charge separation. In this embodiment, the grains tare made of doped silicon, the charge conductor 3 is made of PEDOT, and accordingly the interface 40 is a PEDOT-Si interface. The silicon must be essentially oxide free, i.e. no or very little SiO2 on the Si surface in order to achieve an efficient charge separation of electrons and holes at the PEDOT-Si interface.

2. Conducting Particle—Grains

A layer 26 of metal silicide is formed between the grains 2 and the conducting particles 24 of the first conducting layer. The metal silicide should be of sufficiently high conductivity to minimize resistive losses when electrons are transferred from the grains to the conducting particles. In this embodiment, the conducting particles are made of titanium (Ti), and accordingly the layer 26 between the silicon grains and the titanium particles consists of titanium silicide (TiSi2).

3. Charge Conductor—Metal Silicide—Oxide

To avoid short circuit, there should be an insulating layer 38 between the charge conductor 3, the metal silicide layer 26, and the insulating oxide layer 28. In this embodiment, the insulating layer 38 consists of titanium oxide (TiO2) and silicon oxide (SiO2). The TiO2-SiO2 layer 38 must be sufficiently thick to achieve good electrical insulation between PEDOT and TiSi2. If the TiO2-SiO2 layer 38 is too thin there will be short circuit between PEDOT and TiSi2 with lowered photocurrent and photo voltage as consequence.

4. Charge Conductor—Conducting Particles

In order to achieve insulation between the charge conductor 3 and the conducting particles 24, 25 of the first and second conducting layers, the conducting particles is covered with an insulating oxide layer 28. In this embodiment, the insulating oxide layer 28 consists of titanium oxide, such as TiO2. The titanium oxide layer 28 must be sufficiently thick in order to achieve sufficient electrical insulation between the PEDOT and the titanium. If the titanium oxide layer is too thin, the photo voltage and the photocurrent will be lowered because of short-circuit between PEDOT and titanium.

5. Connection Site—Conducting Particles

Between the conducting particles 25 of the second conducting layer and the connection site 34, there is a conducting a layer 36. In this embodiment, the conducting layer 36 consists of titanium silver (TiAg). The conducting layer 36 must be thick enough to provide a good low ohmic electric contact between the conducting particles 25 of the second conducting layer and the connection site 34, e.g. between the silver (Ag) and the titanium (Ti).

6. Connection Site—Charge Conductor

The charge conductor 3 is in contact with the connection site 34 at an interface 42. The charge conductor 3, in this embodiment PEDOT, should cover the silver of connection site 34 sufficiently to avoid resistive losses in order to achieve maximum photocurrent.

In the following, a plurality of examples of methods for manufacturing the photovoltaic device 2, 30 will be described.

Figure 5:
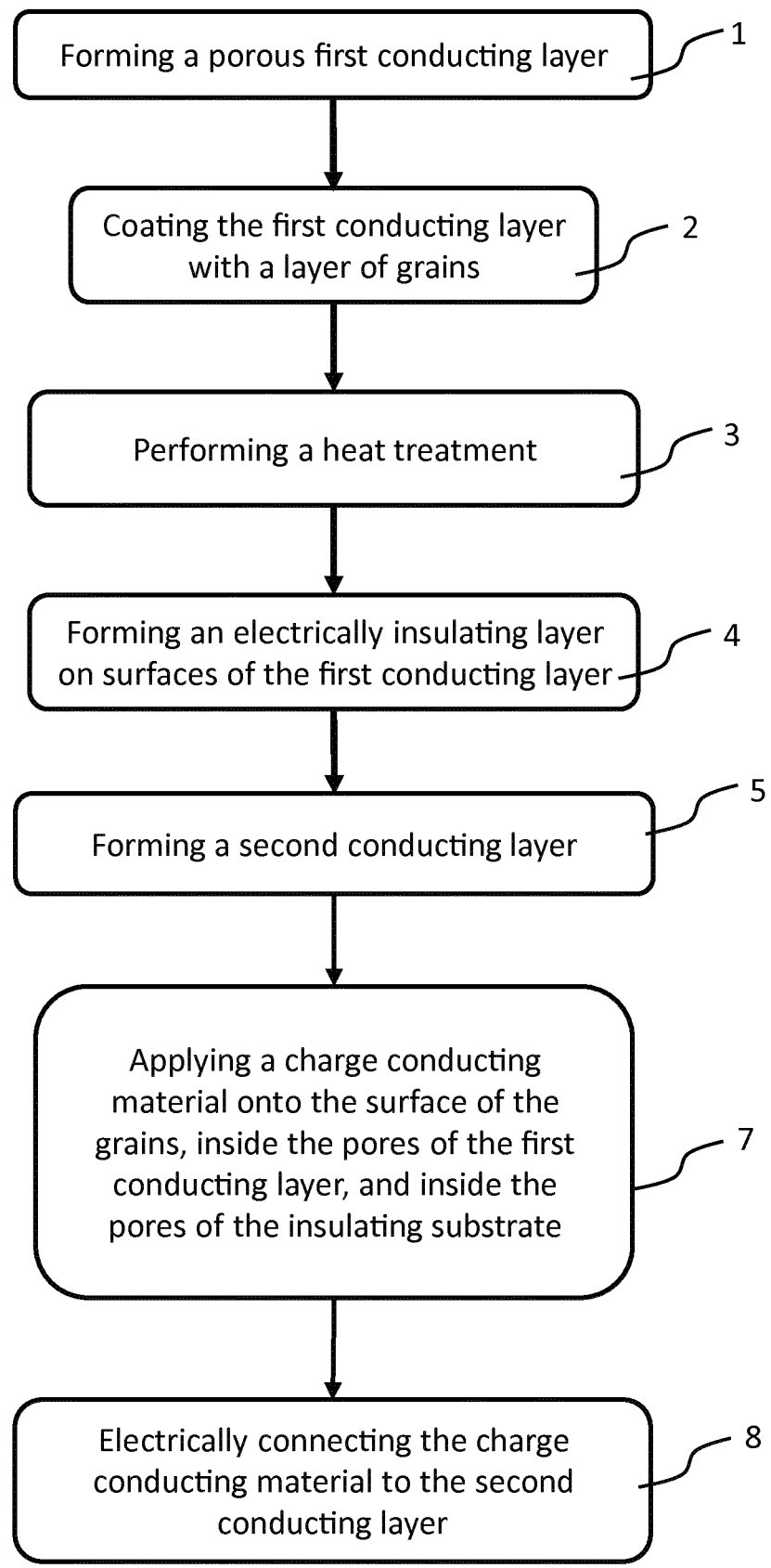
FIG. 5 shows a flowchart of an example of a method for manufacturing a photovoltaic device according to the invention.

FIG. 5 shows a flowchart of an example of a method for manufacturing of a photovoltaic device according to the invention. The 7 steps of the flowchart in FIG. 5 will be explained in more detail in the following. At least some of the steps can be performed in a different order.

Step 1: Forming a porous first conducting layer on one side of a porous insulating substrate. The forming of the first porous conducting layer can be done in different ways. For example, it can be done by spraying or printing with an ink including conducting particles on one side of the porous insulating substrate. The conducting particles can, for example, be made from titanium or an alloy thereof, or aluminium or an alloy thereof. The porous insulating substrate can, for example, be a porous glass microfiber based substrate. Preferably, the conductive particles are larger than the pores of the porous insulating substrate to avoid that the particles penetrate through the porous insulating substrate.

Step 2: Coating the first conducting layer with a layer of grains of a doped semiconducting material to form a structure. In this example, the structure comprises the porous insulating substrate, the first conducting layer, and the layer of grains. The grains are made of a doped semi-conducting material, such as doped silicon. The coating is preferably done so that the surface of the first conduction layer is covered by a monolayer of grains. This can be done by applying a liquid, for example an ink, containing powder of grains onto the first conducting layer. The deposition of the grains can be done by, for example, printing or spraying. Suitable spraying techniques are, e.g. electrostatic spraying or electro spraying. The silicon particles may be etched in a separate step before deposition on the first conducting layer.

The average size of the grains is suitably between 1 μm and 300 μm, preferably between 10 μm and 80 μm, and most preferably between 20-50 μm. The powder of grains can, for example, be produced by grinding. The grinding can, for example, be done by using a disc-type or a cone-type mill. The size and shape of the grains produced during the grinding depends on selected grinding process parameters, such as milling time, milling speed etc. The average size of the grains can be controlled by regulating the grinding process parameters. The average particle size of the powder can, for instance, be measured by using a mesh. The use of meshes for measuring the average particle size of a powder is well-known.

Step 3: Performing a first heat treatment of the structure to bond the grains to the first conducting layer, e.g. to the conducing particles of the first conducting layer. The first heat treatment also bonds the conducting particles in the first conducing layer to each other. Preferably, the heat treatment is performed in a non-oxidizing environment. For example, the structure is heat treated in vacuum with a temperature above 550° C. during at least two hours. The first heat treatment is, for example, done by vacuum sintering of the structure. During this step, the grains and the conducting particles are vacuum sintered. During the sintering, the grains bond to the conducting particles of the first conducting layer to achieve mechanical and electrical contact between them. Also, during vacuum sintering the conducting particles are sintered together to form a first conducting layer with mechanical and electrical contact between the conducting particles.

Step 4: Forming an electrically insulating layer on surfaces of the first conducting layer. This step may include performing a second heat treatment of the structure in an oxidizing environment to form an insulating oxide layer on the available surfaces of the first conducting layer, e.g. on the parts of the surfaces of the conducting particles, which are not in physical contact with the other conducting particles or the grains. This prevents electrical contact between the first conducting layer and the charge conductor, and thus prevents electrons or holes from being transferred between the first conducting layer and the charge conductor, and thereby prevents short circuit between the first and second conducting layer. The oxidizing environment is, for instance, air. The second heat treatment of the structure can be performed at, e.g. 500 C for 30 minutes.

Instead of using the second heat treatment of the structure in an oxidizing environment it is possible to deposit a thin insulating coating onto the available surface of the first conducting layer by printing. By printing a certain amount of an ink containing insulating material on the first conducting layer it is possible to fill the pores in the first conducting layer with ink. By evaporating away the solvent of the ink, insulating material in the ink is deposited onto the available inner and outer surface of the first conducting layer. The dried ink coating can be heated to create an insulating coating that adheres to the available surface of the first conducting layer.

The coating can be porous and alternatively it can be compact. The coating can be made of, e.g. TiO2, Al2O3, ZrO2, aluminosilicate, SiO2 or other electrically insulating materials or combination or mixtures of materials. The coating can be deposited, e.g. by printing an ink containing particles of, e.g. TiO2, Al2O3, ZrO2, aluminosilicate, SiO2, on top of the first conducting layer. If particles are used in the ink the deposited insulating coating can be porous. The particles should have a diameter that is smaller than the pores of the first conducting layer. If the pores in the first conducting layer are around 1 μm then the particles should preferentially have a diameter that is 100 nm or smaller. Alternatively, instead of using an ink that contains particles, the printing ink can contain precursor materials that are converted to, e.g. TiO2, Al2O3, ZrO2, aluminosilicate, SiO2, upon drying and heat treatment of the deposited ink at elevated temperatures in oxygen containing environment such as air. Such precursor materials can form compact deposited insulating coating. Examples of such precursor materials are, e.g. organic titanates (for forming TiO2) or organic zirconates (for forming ZrO2) from the Tyzor™ family manufactured by DuPont. Other precursor materials could be silanes (for forming SiO2) or aluminum chlorohydrate (for forming Al2O3).

It is possible to mix both particles and precursors in the ink for creating an insulating layer on the available surface of the first conducting layer.

It is also possible to carry out the second heat treatment as well as the coating of the surfaces in order to further ensure that the first conducting layer is electrically insulated from the charge conducting material.

Step 5: Forming a second conducting layer. The formation of the second conducting layer can be done at different points in time relative to the other steps depending on the chosen method for forming the second conducting layer. The second conducting layer can be formed in many different ways. In one embodiment, the second conducting layer could be a porous conducting layer formed on an opposite side of the porous insulating substrate. For example, the second conducting layer can be formed by depositing an ink including conducting particles onto the opposite surface of the insulating substrate. In this embodiment, the formation of the second conducting layer can be done before performing the heat treatment in step 3, and even before step 2 or before step 1. Alternatively, the second conducting layer could be formed on a second insulating substrate, and in a next step, the second insulating substrate is attached to the first substrate. Alternatively, the second conducting layer can be an electrically conducting foil that is brought in electrical contact with the charge conducting material. The conducting foil can, e.g. be a metal foil. In this case, the formation of the second conducting layer can be done after step 7.

Step 7: Applying a charge conducting material onto the surface of the grains, inside pores of the first conducting layer, and inside pores of the insulating substrate. The charge conducting material is, for instance, any of a conducting polymer, an inorganic material, and a metal-organic material. The application of the charge conducting material can be done by, for example, applying a liquid base solution containing particles of the charge conducting material onto the surface of the grains so that the solution penetrates into the pores of the first conducting layer, and into the pores of the insulating substrate, and drying the structure so that a layer of solid charge conductor is deposited on the grains and a solid charge conductor is deposited inside the pores of the first conducting layer and the pores of the insulating substrate. Alternatively, the deposition of the charge conducting material can be performed in several steps. For example, the solution with the charge conducting material can first be sprayed onto the grains followed by drying off the solvent to yield a dry solid layer of the charge conducting material on the surface of the grains. In a second step the opposite side of the structure is sprayed with a solution of the charge conducting material. The application of the solution containing the charge conducting material can be done by, for example, soaking or spraying, e.g. ultrasonic spraying. The charge conductor on the surface of the grains covers, for example, at least 50%, and more preferably at least 70%, of the available surface of the grains, and most preferably at least 80% of the surface of the grains. The available surface of the grains is the part of the surface not in contact with the first conducting layer.

Step 8: Electrically connecting the charge conducting material to the second conducting layer. Step 8 can be a part of or a consequence of the steps 5 or 7, or it can be carried out in a separate step. For example, the charge conducting material is applied so that it is in electrical contact with the second conducting layer during step 7. If the second conducting layer is disposed on the surface of the porous insulating substrate, the second conducting layer is in electrical contact with the charge conducting material accumulated in the pores of the insulating substrate. If a second porous insulating substrate is arranged between the first porous insulating substrate and the second conducting layer, and the pores of the second porous insulating substrate are filled with the charge conducting material, the charge conducting material is in electrical contact with the second conducting layer. In those cases, the charge conducting material becomes electrically connected to the second conducting layer when the charge conducting material has been applied to the pores of the porous insulating substrate(s). If the second conducting layer is an electrically conducting foil that is brought in electrical contact with the charge conducting material, the charge conducting material and the second conducting layer are electrically connected during step 5.

The electrical connection of the charge conducting material and the second conducting layer can, for example, be carried out by providing a connection site on the second conducting layer, and electrically connecting the connection site and the charge conducting material. The connection site is physically and electrically connected to both the second conducting layer and the charge conducting material. For example, the connection site comprises a layer of silver (Ag) disposed on the second conducting layer. Alternatively, the second conducting layer may comprise conducting particles made of silver, or another conducting material that do not oxidize during a second heat treatment, which particles form a connection site. It is suitable to use silver, since it provides good electrical contact both with titanium and PEDOT. Another advantage with using silver is that silver prevents formation of oxide on the titanium particles of the second conducting layer in the area of contact between the titanium particles and the connection site. A layer of titanium silver (AgTi) is formed between the titanium particles of the second conducting layer and the connection site during the formation of the layer of silver. Thus, the PEDOT can form a good low ohmic contact with silver and the silver can form a good low ohmic contact with titanium via the AgTi. Consequently, PEDOT can contact the titanium indirectly via the silver and the AgTi. Other materials may be used in the connection site, for example, highly doped silicon or carbon based materials such as, graphite, graphene, CNT or amorphous carbon.

Figure 6:
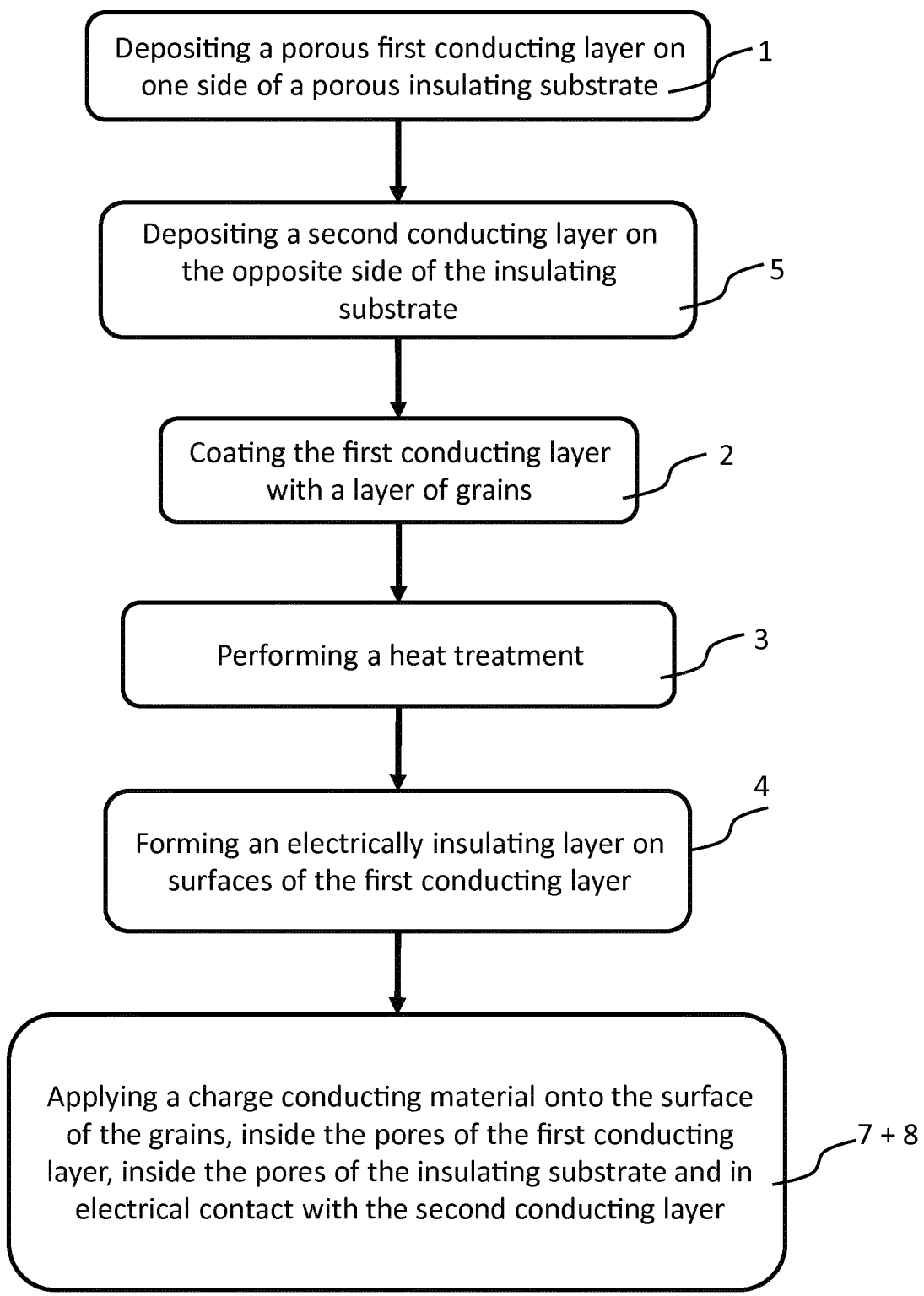
FIG. 6 shows a flowchart of an example of a method for manufacturing a photovoltaic device according to a first embodiment of the invention.

FIG. 6 shows a flowchart of a method for manufacturing a photovoltaic device according to a first embodiment of the invention. This method will result in a monolithic photovoltaic device. The first embodiment of the invention, shown in FIG. 6, comprises the same steps as shown in FIG. 5, however, the steps are carried out in a different order. The steps 1, 2, and 3 can be carried out in the same way as described with reference to FIG. 5 and will not be explained in more details here. In this embodiment, the formation of the second conducting layer in step 5 is done before the first conducting layer is coated with grains, i.e. before step 2. Step 5 can also be performed before step 1.

Step 5: Forming a porous second conducting layer on an opposite side of the porous insulating substrate. For example, the second conducting layer can be formed by depositing a liquid, such as an ink, including conducting particles on the opposite side of the porous insulating substrate. Suitably, the conductive particles are too large to be able to penetrate through the porous insulating substrate. The second conducting layer is deposited in the same way as the first conducting layer. For example, the conducting particles used for the second conducting layer are made of the same material as the conducting particles of the first conducting layer. In one embodiment, the second conducting layer may comprise conducting particles of a material that can withstand oxidation, such as silver or carbon, in order to avoid oxidation of the second conducting layer.

In this embodiment, the structure comprises the porous insulating substrate, the first and second conducting layers and the layer of grains. Thus, conducting particles of the second conducting layer are bonded to each other in step 3, and the available surfaces of the conducting particles of the second conducting layer are covered with an oxide layer in step 4. The charge conducting material is also applied inside pores of the second conducting layer in step 5.

Steps 7+8: The charge conducting material is applied onto the surface of the grains, inside the pores of the first conducting layer, inside the pores of the insulating substrate and in electrical contact with the second conducting layer. Due to the fact that the second conducting layer is disposed on the surface of the porous insulating substrate and the charge conducting material is applied in the pores of the porous insulating substrate, the second conducting layer will have electrical contact with the charge conducting material accumulated in the pores of the insulating substrate.

Figure 7:
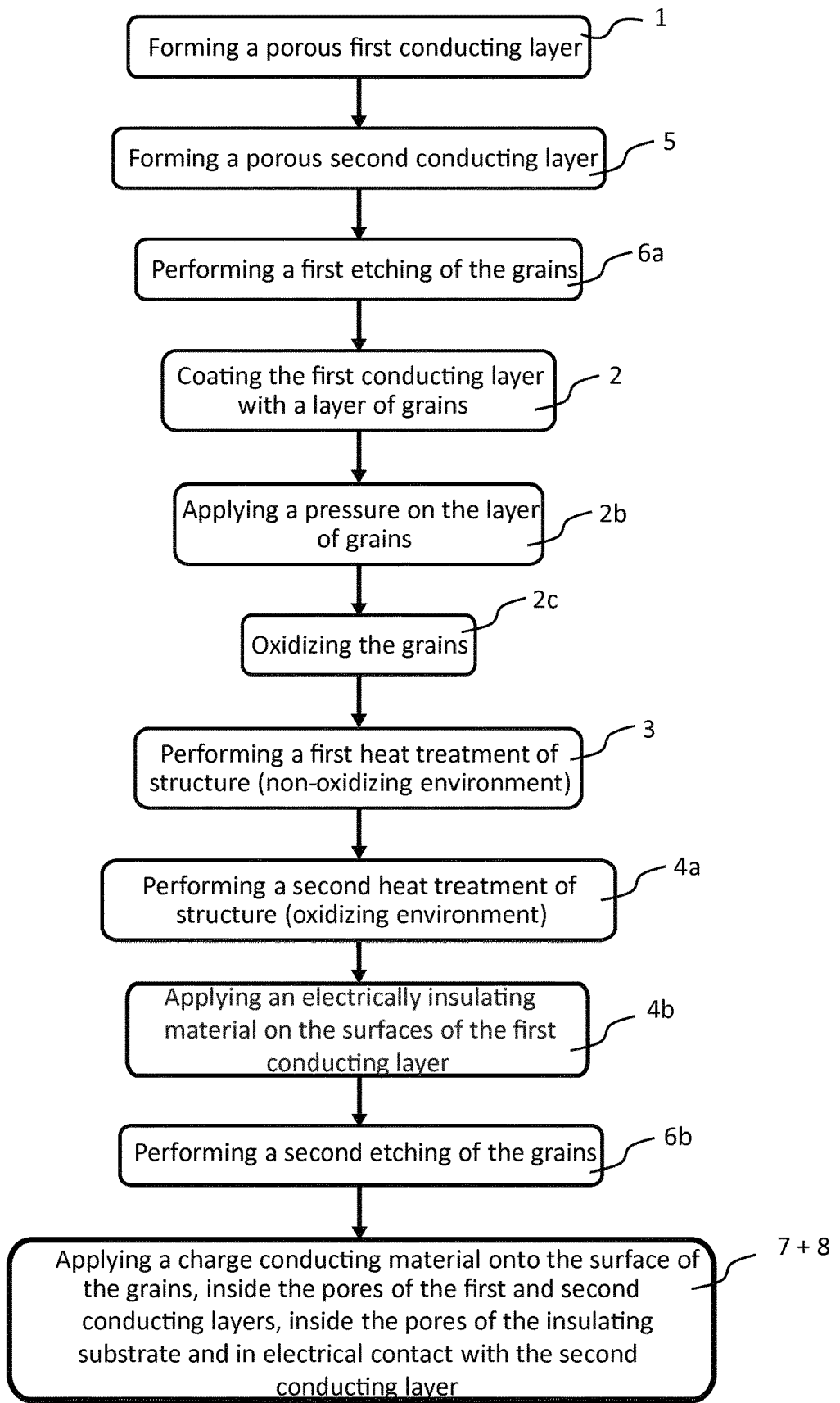
FIG. 7 shows a flowchart of an example of a method for manufacturing a photovoltaic device according to a second embodiment of the invention.

FIG. 7 shows a flowchart of an example of a method for manufacturing a monolithic photovoltaic device according to a second embodiment of the invention. In this embodiment, a more specific example of the manufacturing of a photovoltaic device is explained. This embodiment of the method includes several optional steps which improve the manufacturing of the device and/or improves the performance of the device. In this example, step 4, including the formation of an electrically insulating layer on surfaces of the first conducting layer, comprises two steps: performing a second heat treatment in an oxidizing environment 4a and applying an electrically insulating material on the surfaces of the first conducting layer 4b. In the following, the different steps of the flowchart in FIG. 7 will be explained in more detail.

Step 1: Forming a porous first conducting layer on one side of a porous insulating substrate. In this example, a first ink is prepared by mixing 10 µm sized $TiH_2$ particles with terpineol. The ink comprises $TiH_2$ particles with a diameter that is smaller than 10 micrometres. Subsequently, the first ink is printed or sprayed onto a porous glass microfiber based substrate. The printed layer will form a first porous conducting layer.

Step 5: Forming a porous second conducting layer on an opposite side of the porous insulating substrate. In this example, a second ink is prepared by mixing $TiH_2$ with terpineol. The ink comprises $TiH_2$ particles with a diameter that is smaller than 10 micrometres. The ink is then mixed with silver plated conductive particles in order to make an ink for depositing the second conducting layer. Subsequently, the second ink is printed or sprayed onto the opposite side of the porous insulating substrate. The second printed layer will form a porous second conducting layer. The silver plated conductive particles form a connection site for electrically connecting the second conducting layer with the charge conducting material in step 8. Alternatively, a layer of silver or another suitable material is applied to the surface of the second conducting layer in order to form a connection site.

Step 6a (optional): Performing a first etching of the grains. The first etching is an anisotropic etching of the grains. The etching of the grains can be performed using, e.g. isotropic etching solutions or anisotropic etching solutions. Anisotropic etching of the grains, e.g. silicon grains, can be used for a pyramid shaped etch pit where the pyramid shaped grain surface can increase the effective light absorption by the grain. The etching can, for example, be made using potassium hydroxide (KOH). The first etching provides grains predominantly having {111} planes exposed at the surface of the grains. The charge conductor is in contact with the {111} pyramidal planes of the grains. This causes light trapping, which means that the light is reflected several times in the surfaces, and by that the light absorption of the grains is increased. If the grains are made of doped silicon, the object of the etching is to form {111} pyramidal planes on the silicon. The etching step is carried out before coating the first conducting layer with the grains. Alternatively, this step is carried out before step 1 and 1b.

Step 2: Coating the first conducting layer with a layer of grains of a doped semiconducting material to form a structure. This step can be carried out in the same way as previously described with reference to FIG. 5.

Step 2b (optional): Applying a pressure on the layer of grains so that portions of the grains project into the first porous conducting layer before performing the first heat treatment of the structure. For example, the pressure can be applied on top of the grains by using a membrane press or by using a roller press. Thus, the areas of the contact surfaces between the grains and the porous conducting layer are increased and consequently the bonding between the grains and the porous conducting layer is facilitated. The increased contact area further leads to an improved electrical contact between the grains and the conducting layer.

Step 2c (optional): Oxidizing the grains before performing the first heat treatment of the structure. The oxidation provides the surface of the grains with a protective oxide layer, which protect the grains from contamination during the first heat treatment. The oxidation can be done, for example, by exposing the grains to air or oxygen gas with or without water present at an elevated temperature of 500 C or higher. The presence of water promotes the oxidation.

Step 3: Performing a first heat treatment of the structure in a non-oxidizing environment to bond the grains to the first conducting layer. Further, the conducting particles of the first and second conducting layers are bonded to the other conducting particles in the layer during the first heat treatment. The structure is heat treated under vacuum until the grains have been sintered to the first porous conducting layer. During the sintering, the grains bond to the conducting particles of the first conducting layer to achieve mechanical and electrical contact between them. Also, during the vacuum sintering the conducting particles are sintered together to form a first conducting layer with mechanical and electrical contact between the conducting particles. Preferably, the structure, including the substrate, the first and second conducting layers and the layer of grains, is heat treated in vacuum with a temperature above 550° C. during at least two hours. For example, the printed substrate is vacuum sintered at 650° C. and then allowed to cool down to room temperature. The pressure during sintering is lower than 0.0001 mbar.

In this example, the grains are made of doped silicon and the conducting particles are made of titanium. During the heat treating in vacuum, the silicon of the grains and the titanium of the particles are reacting and form titanium silicide in the boundaries between the grains and the particles. Thus, layers of titanium silicide are formed between the grains and the particles of the first conducting layer, which improves the electrical contact between the grains and the particles.

Step 4a: Performing a second heat treatment of the structure, i.e. the insulating substrate, the first and second conducting layers, and layer of grains in an oxidizing environment to form an insulating oxide layer on the available surfaces of the conducting particle of the first and second conducting layers. The structure is heat treated in air until the available surfaces of first porous conducting layer have been oxidized. For example, the structure is heat treated in air to achieve an electrically insulating oxide layer on the conducting particles of the first and second conducting layer. The surfaces of the silicon particles also become oxidized during the second heat treatment.

Step 4b: Applying an electrically insulating material on the surfaces of the first conducting layer. In addition to using the second heat treatment of the structure in an oxidizing environment it is possible to deposit a thin insulating coating onto the available surfaces of the first conducting layer, for example, by printing. By printing a certain amount of an ink containing insulating material on the first conducting layer it is possible to fill the pores in the first conducting layer with ink. By evaporating away the solvent of the ink, insulating material in the ink is deposited onto the available inner and outer surface of the first conducting layer. The dried ink coating can be heated to create an insulating coating that adheres to the available surface of the first conducting layer. The coating may consist of, e.g. TiO2, Al2O3, ZrO2, aluminosilicate, SiO2 or other electrically insulating materials or combination or mixtures of materials. The coating can be deposited, e.g. by printing an ink containing particles of, e.g. TiO2, Al2O3, ZrO2, aluminosilicate, SiO2, on top of the first conducting layer. If particles are used in the ink the deposited insulating coating can be porous. The particles should have a diameter that is smaller than the pores of the first conducting layer. If the pores in the first conducting layer are around 1 μm then the particles should preferentially have a diameter that is 100 nm or smaller. Alternatively, instead of using an ink that contains particles the printing ink can contain precursor materials that are converted to, e.g. TiO2, Al2O3, ZrO2, aluminosilicate, SiO2, upon drying and heat treatment of the deposited ink at elevated temperatures in oxygen containing environment such as air. Such precursor materials can form compact deposited insulating coating. Examples of such precursor materials are, e.g. organic titanates (for forming TiO2) or organic zirconates (for forming ZrO2) from the Tyzor™ family manufactured by DuPont. Other precursor materials could be silanes (for forming SiO2) or aluminum chlorohydrate (for forming Al2O3). It is possible to mix both particles and precursors in the ink for creating an insulating layer on the available surface of the first conducting layer.

Step 6b (optional): Performing a second etching of the grains after performing the second heat treatment and before applying the charge conducting material onto the surfaces of the grains. The second etching is, for example, an isotropic etching of the grains and is used to remove oxide and impurities from the surfaces of the grains. The second etching can, for example, be carried out by treating the surface of the grains with hydrogen fluoride (HF).

This can be done, for example, with methods, such as exposing the surface of the grains to HF in the form of a solution of HF in water, or by exposing the surface of the grains to gaseous HF. The HF treatment has the effect of removing oxide, for example silicon oxide, from the surface of the grains. The second etching of the grains provides cleaning of the surfaces of the grains before applying the charge conducting material, which improves the electrical contact between the grains and the charge conducting material. In this example, the second etching of the silicon grains removes the silicon oxide of the grains by treating the surface of the silicon grains with HF.

Step 7+8: Applying a charge conducting material onto the surface of the grains, inside pores of the first and second conducting layers, and inside the pores of the insulating substrate and in electrical contact with the second conducting layer. In this example, the charge conducting material is in electrical contact with the silver plated particles in second conducting layer. In this example, the charge conducting material is PEDOT:PSS. The PEDOT:PSS is deposited onto the surface of the silicon grains and inside pores of the first conducting layer and inside the pores of the insulating substrate and inside the pores of the second conducting layer. The PEDOT:PSS can be deposited from, e.g. a water based solution containing PEDOT:PSS. The PEDOT:PSS solution can be deposited by soaking the substrate with the first and second conducing layers and the silicon grains in a solution of PEDOT:PSS. Alternatively the PEDOT:PSS deposition can be performed in several steps. For example, the PEDOT:PSS solution can first be sprayed onto the silicon grains followed by drying off the solvent to yield a dry solid PEDOT:PSS layer on the surface of the silicon grains. In a second step the second conducting layer is sprayed with a solution of PEDOT:PSS. A suitable spraying technique to achieve a thin layer of PEDOT:PSS on the silicon grains is, e.g. ultrasonic spraying.

Figure 8:
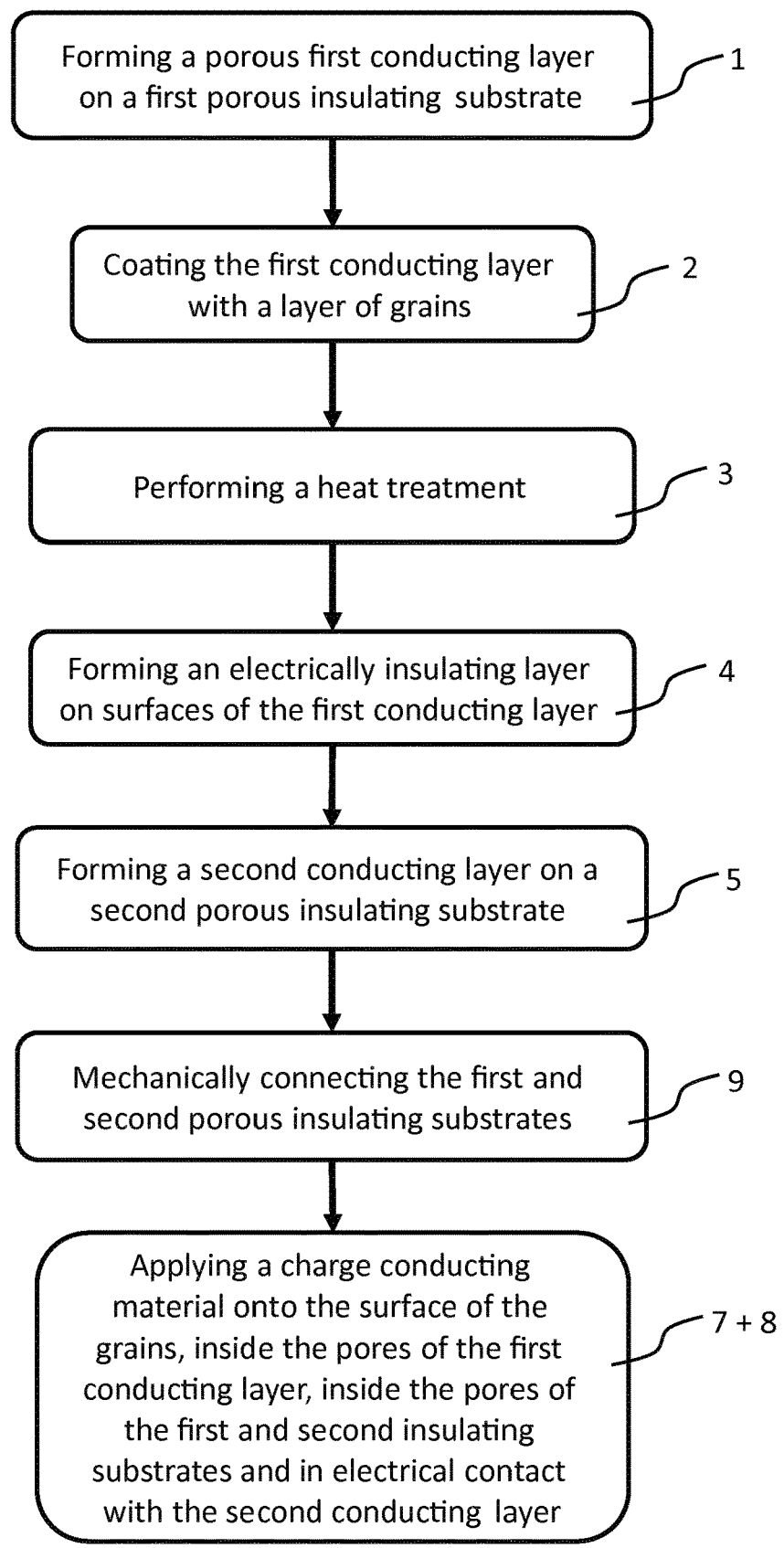
FIG. 8 shows a flowchart of an example of a method for manufacturing a photovoltaic device according to a third embodiment of the invention.

FIG. 8 shows a flowchart of a method for manufacturing a photovoltaic device of a sandwich type according to a third embodiment of the invention. This embodiment of the invention shows how the manufacturing of the photovoltaic device would be performed when using a second specific example to form the second conducting layer. In the following, the different steps of the flowchart in FIG. 8 will be explained more thoroughly.

The third embodiment of the invention, shown in FIG. 8, comprises the same steps 1-4 as shown in FIG. 5.

Step 5: Forming a second conducting layer on a second porous insulating substrate. The second conducting layer is formed on a second porous insulating substrate. The second conducting layer can be applied on the second substrate in many different ways, for example, in the same way as previously described. The second conducting layer does not need to be porous. The second conducting layer can, for example, be a metal foil attached to the second porous insulating substrate.

Step 9: Mechanically connecting the first and second porous substrates to each other to form a single structure. For example, the first and second porous substrates are glued together to form a single substrate with the first and second conducting layers arranged on opposite sides of the substrate.

Step 7+8: Applying a charge conducting material onto the surface of the grains, inside the pores of the first conducting layer, inside the pores of the first and second insulating substrates and in electrical contact with the second conducting layer. This step can be carried out in the same way as previously described.

The steps 1-5 and 1, 8 are steps that need to be performed when producing a photovoltaic device according to the invention. The step of forming a second conducting layer, i.e. step 5 can be performed in different ways and at different times in the process, depending on how the step is performed, which is shown in FIGS. 6 and 8. There are some examples of steps shown in FIG. 7, steps 2b, 2c, 6a, and 6b, which are advantageous to perform, although not strictly necessary to do, and either all, some or none of these steps can be performed. The steps can, however, be useful to perform since they can increase the performance of the photovoltaic device. Preferably, either of or both of the steps 4a, 4b are performed.

The present invention is not limited to the embodiments disclosed but may be varied and modified within the scope of the following claims. Many of the method steps can be carried out in different order. For example, the formation of the second conducting layer can be carried out before as well as after performing the first heat treatment of the structure. The second conducting layer can be porous or solid. For example, the second conducting layer can be a metal foil. The second conducting layer can be applied directly on the surface of the insulating substrate or be arranged at a distance from the insulating substrate. The first etching of the grains can, for example, be performed before the first and second conducting layers are formed.

The invention claimed is:

1. A method for manufacturing a photovoltaic device comprising:
    forming a porous first conducting layer (16) on one side of a porous insulating substrate (20),
    coating the first conducting layer with a layer of grains (2) of a doped semiconducting material to form a structure, performing a first heat treatment of the structure to bond the grains to the first conducting layer, forming electrically insulating layers on surfaces of the first conducting layer, forming a second conducting layer (18) on an opposite side of the porous insulating substrate (20), applying a charge conducting material (3) onto the surfaces of the grains, inside pores of the first conducting layer, and inside pores of the insulating substrate, and electrically connecting the charge conducting material to the second conducting layer.

2. The method according to claim 1, wherein said layer (6) of grains is a monolayer.

3. The method according to claim 1, wherein the first conducting layer (16) is coated by depositing an ink including a powder of said grains (2) on the first conducting layer.

4. The method according to claim 3, wherein said ink including the grains (2) is deposited on the first conducting layer (16) by electrostatic spraying.

5. The method according to claim 1, wherein the method comprises oxidizing the grains (2) before performing the first heat treatment of the structure.

6. The method according to claim 1, wherein said grains (2) are made of doped silicon.

7. The method according to claim 1, wherein the method comprises performing a first etching of the grains (2) to form (111) pyramidal planes on the grains before coating the first conducting layer (16) with the grains.

8. The method according to claim 1, wherein the method comprises performing a second etching of the grains (2) before applying the charge conducting material (3) onto the surfaces of the grains.

9. The method according to claim 1, wherein the charge conducting material (3) is any of a conducting polymer, an inorganic material, and a metal-organic material.

10. The method according to claim 1, wherein the step applying a charge conducting material (3) onto the surface of the grains (2) comprises applying a liquid based solution containing particles of the charge conducting material onto the surface of the grains, inside pores of the first conducting layer, and inside the pores of the insulating substrate, and drying the structure so that a layer (6) of solid charge conductor is deposited on the grains and a solid charge conductor is deposited inside the pores of the first conducting layer and the pores of the insulating substrate.

11. The method according to claim 1, wherein the step forming a porous first conducting layer (16) on one side of the porous insulating substrate (20) comprises depositing an ink including conducting particles (24) on one side of the porous insulating substrate.

12. The method according to claim 1, wherein the grains (2) are made of doped silicon, the first conducting layer comprises particles (24) of metal or a metal alloy, and a zone of metal silicide or a metal silicon alloy (26) is formed in the boundaries between the grains and the particles during the first heat treating.

13. The method according to claim 1, wherein the step forming electrically insulating layers on surfaces of the first conducting layer (16) comprises performing a second heat treatment of the structure in an oxidizing environment to form insulating oxide layers (28) on the available surfaces of the first conducting layer.

14. The method according to claim 1, wherein the step forming electrically insulating layers on surfaces of the first conducting layer (16) comprises depositing an insulating coating onto the available surfaces of the first conducting layer.

15. A method for manufacturing a photovoltaic device comprising:

forming a porous first conducting layer (16) on one side of a porous insulating substrate (20), coating the first conducting layer with a layer of grains (2) of a doped semiconducting material to form a structure, performing a first heat treatment of the structure to bond the grains to the first conducting layer, forming electrically insulating layers on surfaces of the first conducting layer, forming a second conducting layer (18) on an opposite side of the porous insulating substrate (20), applying a charge conducting material (3) onto the surfaces of the grains, inside pores of the first conducting layer, and inside pores of the insulating substrate, and electrically connecting the charge conducting material to the second conducting layer, wherein the average size of the grains (2) is between 1 μm and 300 μm.

16. The method according to claim 15, wherein the average size of the grains (2) is between 10 μm and 80 μm.

17. The method according to claim 16, wherein the average size of the grains (2) is between 20-50 μm.

* * * * *